US006801060B2

(12) United States Patent
Ikehashi et al.

(10) Patent No.: US 6,801,060 B2
(45) Date of Patent: Oct. 5, 2004

(54) SEMICONDUCTOR INTEGRATED CIRCUIT

(75) Inventors: Tamio Ikehashi, Kamakura (JP); Yoshihisa Sugiura, Kamakura (JP); Kenichi Imamiya, Kawasaki (JP); Ken Takeuchi, Tokyo (JP); Yoshihisa Iwata, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 10/443,820

(22) Filed: May 23, 2003

(65) Prior Publication Data

US 2003/0218497 A1 Nov. 27, 2003

Related U.S. Application Data

(60) Continuation of application No. 10/200,152, filed on Jul. 23, 2001, now Pat. No. 6,590,444, which is a division of application No. 10/023,946, filed on Dec. 21, 2001, now abandoned, which is a division of application No. 09/375,370, filed on Aug. 17, 1999, now Pat. No. 6,351,179.

(30) Foreign Application Priority Data

Aug. 17, 1998 (JP) .......................................... 10-230478

(51) Int. Cl.[7] ................................................ H03K 5/153
(52) U.S. Cl. ............................ 327/80; 327/78; 327/205
(58) Field of Search ............................. 327/77, 78, 80, 327/81, 205

(56) References Cited

U.S. PATENT DOCUMENTS

| | | | | |
|---|---|---|---|---|
| 4,485,433 A | | 11/1984 | Topich | |
| 4,560,889 A | * | 12/1985 | Hayashi | 327/143 |
| 4,683,382 A | | 7/1987 | Sakurai et al. | |
| 4,888,497 A | * | 12/1989 | Dallabora et al. | 327/143 |
| 5,249,155 A | | 9/1993 | Arimoto et al. | |
| 5,334,883 A | * | 8/1994 | Rosenthal | 327/206 |
| 5,337,284 A | | 8/1994 | Cordoba et al. | |
| 5,394,104 A | * | 2/1995 | Lee | 327/143 |
| 5,396,114 A | | 3/1995 | Lee et al. | |
| 5,408,435 A | * | 4/1995 | McClure et al. | 365/201 |
| 5,493,234 A | | 2/1996 | Oh | |
| 5,694,365 A | | 12/1997 | Nakai | |
| 5,703,512 A | * | 12/1997 | McClure | 327/198 |

(List continued on next page.)

OTHER PUBLICATIONS

Kiyoo Ito, "Super LSI Memory," Baifukan, pp. 267–269, 307–310 (1994) (w/English translation of relevant parts).

*Primary Examiner*—Terry D. Cunningham
(74) *Attorney, Agent, or Firm*—Banner & Witcoff, Ltd.

(57) ABSTRACT

In order to avoid any malfunction for a temporary change in power supply voltage and suppress decrease in internal power supply voltage when transition is effected from the stand-by mode to the active mode, the disclosed semiconductor integrated circuit is provided with a detecting circuit which prevents malfunction in a temporary change in the power supply voltage from occurring by changing a detection level according to when the power supply voltage is increased or decreased. Further, a decrease in the internal power supply voltage immediately after the transition from the stand-by mode to the active mode is suppressed by employing a PMOS down converter in the stand-by mode and an NMOS down converter in the active mode, and setting an internal power supply voltage of the PMOS down converter in the stand-by mode higher than in the active mode. A down converter is formed in a lower layer of an external power supply line and peripheral circuit blocks are arranged in a lower layer of internal power supply lines on both sides of the external power supply line symmetrically with respect thereto, whereby a power supply distance of the power supply voltage is minimized and controllability of the internal power supply voltage is improved.

4 Claims, 17 Drawing Sheets

U.S. PATENT DOCUMENTS 5,744,996 A 4/1998 Kotzle et al.
5,804,996 A * 9/1998 Verhaeghe et al. ........... 327/77
5,969,420 A 10/1999 Kuge et al.
6,064,557 A 5/2000 Yamasaki et al.
6,078,201 A * 6/2000 Crotty ........................ 327/143
6,140,805 A 10/2000 Kaneko et al.
6,181,172 B1 * 1/2001 Callahan ..................... 327/143
6,188,244 B1 * 2/2001 Joo et al. ...................... 326/83
6,259,286 B1 * 7/2001 Papaliolios ................. 327/143
6,492,848 B1 * 12/2002 Lee ............................ 327/143

* cited by examiner $$Vref' = \begin{cases} Vref & (EXVDD=\text{"L"}) \\ \frac{R14}{R13+R14}\,Vext & (EXVDD=\text{"H"}) \end{cases}$$

$$\left(\begin{array}{c} 0 < V1 < V2 < Vint \\ V1 \approx 0.9V \\ V2 \approx 1.8V \end{array}\right)$$

FIG. 31A
(PRIOR ART)
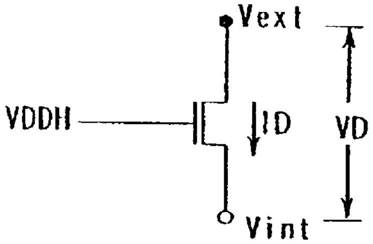
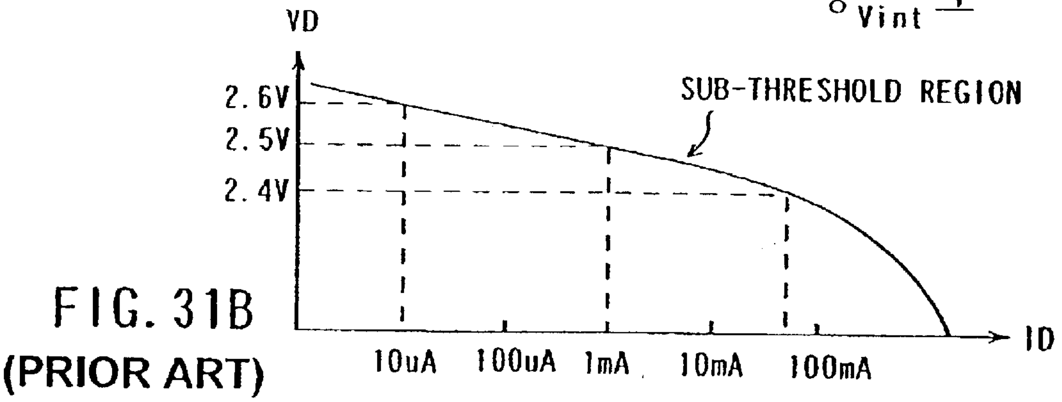
FIG. 31B
(PRIOR ART)
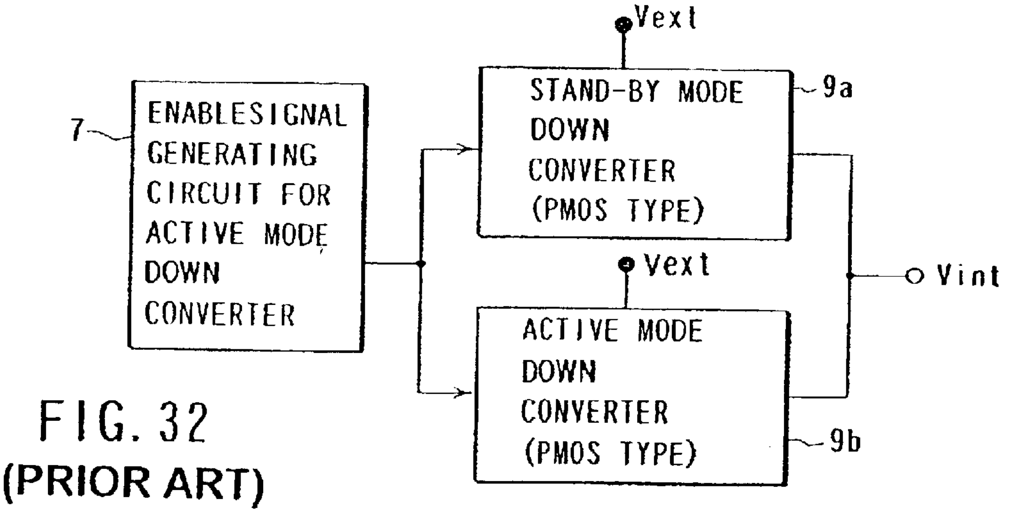
FIG. 32
(PRIOR ART)
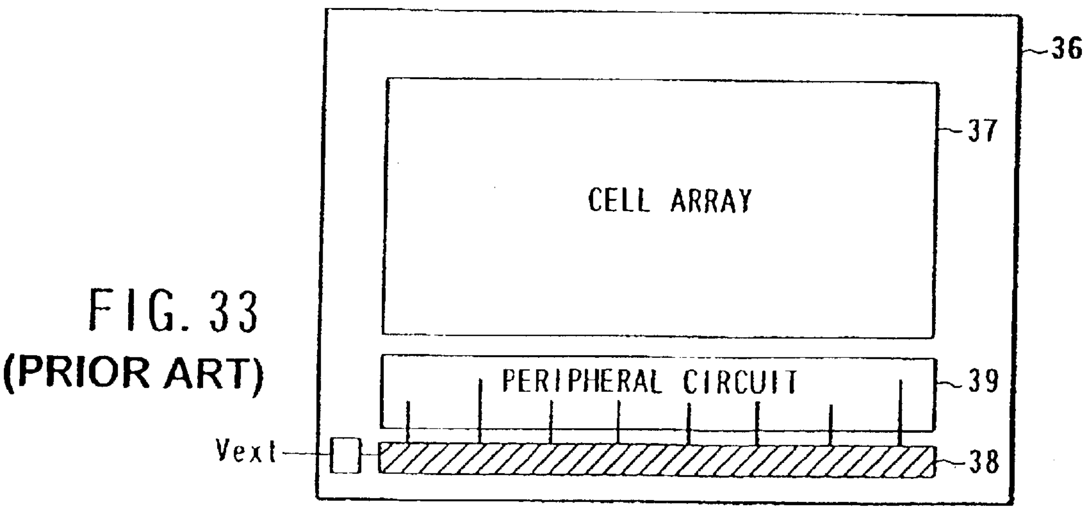
FIG. 33
(PRIOR ART)

SEMICONDUCTOR INTEGRATED CIRCUIT

CROSS-REFERENCE TO RELATED APPLICATION

This application is a continuation of U.S. patent application Ser. No. 10/200,152, filed Jul. 23, 2002, which now U.S. Pat. No. 6,590,444 is a divisional of U.S. patent application Ser. No. 10/023,946, filed Dec. 21, 2001 (now abandoned), which is a divisional of U.S. patent application Ser. No. 09/375,370, filed Aug. 17, 1999, now U.S. Pat. No. 6,351, 179, issued Feb. 26, 2002, which is based upon and claims the benefit of priority from the prior Japanese Patent Application No. 10-230478, filed Aug. 17, 1998, the entire contents of which are incorporated herein by reference.

BACKGROUND OF THE INVENTION

The present invention relates to a semiconductor integrated circuit and particularly, to a configuration and layout of a power supply circuit of the semiconductor integrated circuit which prevents a malfunction in a semiconductor integrated circuit caused by a transient change in power supply voltage when a power supply is turned on from occurring and suppresses a decrease in internal power supply voltage immediately after a transition from a stand-by mode to an active mode.

Conventionally, a power-on circuit has been known as a power supply voltage detecting circuit which generates a signal by detecting an increase and a decrease in power supply. When a power supply is turned on, a power supply voltage is increased and exceeds a preset value, a detection signal is generated and a prescribed latch in a semiconductor integrated circuit is reset to a required initial state using the signal. On the other hand, when a power supply voltage is decreased and reaches a preset value, a detection signal is generated, a prescribed latch is reset as in when a power supply is turned on. Then, description will be given of a necessity of resetting of a prescribed latch when a power supply voltage is decreased, taking a non-volatile memory having a floating gate as example.

A sectional view of a structure of a non-volatile memory cell is shown in FIG. 26. Cells 1 and 2 are formed on a silicon substrate, wherein a control gate 40 and a floating gate 41 are provided to each of the cells 1 and 2, channels are formed on the surface of a P well 42 and N-type diffusion layers 43 formed on the P well 42 are respectively used as a source and a drain.

A write operation of the non-volatile memory cell is effected by applying a high voltage of the order of 20V between the control gate 40 and the P well 42 with the control gate 40 being set positive. At this point, electrons are injected into the floating gate 41 from the P well 42 and the memory cell is in a written state.

Then, an erase operation is effected by applying a high voltage of the order of 20V between the control gate 40 and the P well 42 with a potential of the control gate 40 being set 0 or negative, contrary to the write operation, to draw back the electrons in the floating gate 41 injected in the write operation to the P well 42. A situation in which the cell 1 is erased is shown in FIG. 26.

That is, for example, when the cell 1 is selected on the assumption that the cells 1 and 2 of FIG. 26 each are in a written state and if the control gate 40 and the P well are respectively applied with 0V and 20V, electrons ($e^-$) injected in the floating gate 41 are drawn back to the P well 42 by a tunnel effect to have the cell 1 to be an erased state.

At this point, the control gate 40 is applied with 20V in a non-selected cell 2 and no potential difference between the floating gate 41 and the P well 42 arises. Therefore, electrons injected in the floating gate 41 of the cell 2 are retained.

However, in a case where a power supply voltage is decreased in the erase operation for some reason, a logic circuit malfunctions due to the voltage decrease and in turn, a voltage of the control gate 40 of the cell 2 is decreased to 0V although the voltage should normally be applied with 20V. With the decrease in the voltage, electrons in the floating gate 41 of the cell 2 which should normally be retained are drawn back to the P well 42, thereby effecting an erroneous erase operation.

In order to prevent such a malfunction, it is indispensable that a decrease in power supply voltage is detected immediately when it arises and a potential of the P well 42 be decreased from 20V to 0V. A power-on signal to be generated when the power supply voltage is decreased is necessary for such a recovery operation.

Conventionally, as a circuit which generates a power-on signal, a power supply voltage detecting circuit as shown in FIG. 27 has been employed. The power supply voltage detecting circuit of FIG. 27 is constructed of: a power supply; resistors R1, R2 and R3; an N channel MOS transistor (hereinafter referred to as NMOS) M1 with a threshold voltage Vtn; a P channel MOS transistor (hereinafter referred to as PMOS) M2 with a threshold voltage Vtp; a node N1 connecting a connection point between the resistors R1 and R2 and the gate of PMOS (M2) with each other; a node N2 connecting the drain of PMOS (M2) and the resistor R3; and two inverters 15 and 16 connected to the output side. A power supply voltage and a voltage of the node N1 when a power supply is turned on are respectively denoted by V and VN1, then VN1 is given as follows:

$$VN1=R1\times Vtn/(R1+R2)+R2\times V/(R1+R2) \tag{1}$$

In a case where, when a power supply is turned on, a difference between V and VN1 exceeds the absolute value |Vtp| of a threshold voltage of PMOS (M2), that is, when the power supply voltage is higher than Vdetect, which is expressed as follows:

$$V\text{detect}=Vtn+|Vtp|\times(R1+R2)/R1 \tag{2}$$

a potential of the node N2 goes to high level (hereinafter expressed as "H") and an output of the power-supply detecting circuit changes to "H" from a low level (hereinafter referred to as "L"). With this operation adopted, a prescribed latch in a semiconductor integrated circuit can be reset. When a power supply voltage is decreased and reaches the level of the equation (2), the output changes from "H" to "L" and the prescribed latch can be reset.

Incidentally, in FIG. 27, the gate and drain of NMOS (M1) are connected with each other and used as an NMOS connected as a diode. Further, the resistor R2 may be removed in the circuit shown in FIG. 27 since no problem occurs even if the resistance R2=0 in the equations (1) and (2).

The power supply voltage detecting circuit is employed in a circuit system in which no down converter is provided. In a circuit system in which an external power supply voltage Vext is decreased to an internal power supply voltage Vint using a down converter, a configuration and function of the power supply voltage detecting circuit is more or less altered.

The down converter system used herein (see "Super LSI memory," authored by Shizuo ITO published by BAIFU KAN, p 267) is a circuit system in which Vext (for example, 3V) which is supplied from the outside of a semiconductor chip is decreased to Vint (for example, 2.5V) using a down converter and the Vint is used as a power supply for an internal circuit in the semiconductor integrated circuit.

A down converter system is especially widely used in semiconductor integrated circuits such as a memory and is useful as a very effective measure to cope with reduction in breakdown voltage of a transistor used in an internal circuit, which accompanies progress in microfabrication technique, and further, becomes an important measure to support a trend toward a multiple power supply for a semiconductor integrated circuit.

In a down converter system, two kinds of power supply detecting circuits for Vext and Vint are required. A Vext detecting circuit detects an increase in Vext and activates a down converter and a reference voltage (hereinafter referred to as Vref) generating circuit, while, when Vext is decreased, the circuit provides a function similar to a conventional manner.

A Vint detecting circuit further functions to reset a latch to a required initial condition in an increase in Vint as in a conventional manner when a power supply is turned on. However, when Vint is decreased, the Vint detecting circuit is not required to output a signal. The reason why is that the Vext detecting circuit detects a decrease in external power supply voltage prior to a decrease in internal power supply voltage Vint.

If functions of the Vext and Vint detecting circuits are considered, it is understood that a detecting circuit which outputs signals when a power supply voltage reaches the same voltage level in both cases of an increase and a decrease in power supply voltage may be adopted as a Vext detecting circuit as in a conventional manner. On the other hand, if such a circuit is adopted as a Vint detecting circuit, a problem which will be described below arises.

While Vint in a down converter system is generated by decreasing Vext using a down converter, characteristics of the down converter are, in the case, required to be determined so that a voltage level of Vint is constant regardless of a magnitude of Vext and an amount of a current consumption of an internal circuit.

However, when a lot of current is consumed in a short time in the internal circuit, an instantaneous decrease in voltage level Vint cannot be prevented from occurring. Such a situation occurs, for example, in cases where an extremely large capacitance is charged from 0V to Vint in voltage level and data are inverted in a number of latches at almost the same point of time, whereby a lot of current flows through circuits in an instant, and the like case. The term "current flowing through circuits" is that while a power supply current is normally interrupted in the course of inversion of a CMOS gate, the current flows through in an unexpected instant.

Once the Vint detecting circuit detects such a temporary decrease in Vint, there arises a problem that a latch in which important information such as an address, written data in a memory cell is stored is reset to an initial state.

Incidentally, as described above, while a down converter decreases Vext and generates Vint and consumes a current constantly in order to keep Vint at a constant level, an amount of the current consumption is different according to an ability of the down converter (an ability to keep Vint at a constant level) and as the ability is higher, the current consumption is increased.

In order to suppress power consumption in the down converter as low as possible, there have been proposed various kinds of systems in which an internal circuit is respectively operated according to two cases: one case in an active mode where a large current is consumed and thereby, a high ability is required for the circuit and the other in a stand-by mode where almost no current flows through an internal circuit (see "Super LSI memory," authored by Shizuo ITO published by BAIFU KAN, pp. 307 to 310).

FIG. 28 conceptually shows a configuration in which an internal circuit is differently operated according to cases. While a stand-by mode down converter 9 whose power consumption is low is constantly operated, an active mode down converter 10 whose power consumption is high is operated only in an active mode. In a conventional example shown in FIG. 28, Vint of the stand-by mode down converter 9 and Vint of the active mode down converter 10 are both set to the same voltage level.

A conventional active mode down converter 10 is a circuit with a high speed response in order to suppress a fluctuation in Vint. However, a time period is required from when an enable signal generating section 7 of an active mode down converter outputs an enable signal till the active mode down converter 10 reaches an operating state. When, during such a time period, an internal circuit 11 consumes a large current, there arises a problem that the stand-by mode down converter 9 cannot singly suppress fluctuations in Vint and thereby Vint is decreased. The decrease in Vint is about 0.2V.

Then, the reason why a power supply for a chip is required to adopt a multiple power supply system such as in the case of a combination of Vext and Vint and down converters which have conventionally been studied will be described in a more detailed manner of the case of a semiconductor integrated circuit such as a memory as central issues.

According to a scaling rule of a transistor, when a size of a transistor is reduced to 1/K of the original size, a magnitude of a power supply voltage is also required to be 1/K of the original voltage, in order to operate a transistor under the same electric field strength. Actually, however, the power supply voltage cannot freely be changed since the voltage is dependent on systems which are incorporated in a chip.

Hence, it has often been conducted that only sizes of transistors are reduced while a magnitude of a power supply voltage of the preceding generation is maintained. In this case, a power supply voltage is decreased on a chip and such a decreased voltage is applied to miniaturized transistors in use for an internal circuit in order that an immunity to the hot-electron effect of the transistors is not problematic in practical aspects.

In a concrete manner of description, while it is desirable from the viewpoint of high integration and realization of a high speed that a gate oxide film of an MOS transistor is thinned in a semiconductor integrated circuit of a memory such as DRAM or a non-volatile memory, there arise problems of reliability such as dielectric breakdown of the gate oxide film, reduction in hot electron resistance if the gate oxide film is only thinned without any decrease in the power supply voltage.

When a gate length of an MOS transistor is shortened and thereby, an electric field strength in the drain region is increased, electrons/holes which are accelerated in the drain region become a high energy state and are injected into a gate oxide film or the like, which results in deterioration of characteristics of the MOS transistor. The hot electron resistance herein is an ability whereby the transistor endures such a phenomenon.

Accordingly, when a thin oxide film is used, it is indispensable that a power supply voltage is decreased and the hot electron resistance is improved, but there is existent an MOS transistor with a thick gate oxide film which does not require reduction in power supply voltage in a CPU and the like, which are in a mixed manner formed on the same chip together with the DRAM, a non-volatile memory or the like, and which share the same power-supply. A power supply voltage for an MOS transistor in such a CPU and the like are not desired to be reduced together with a collective reduction in power supply voltage of the entire system since the reduction results in a decreased operating speed of the system.

For this reason, a down converter system is effective in which Vext supplied from the outside of a semiconductor integrated circuit is decreased and thus decreased voltage is used as Vint for an internal circuit. The voltage-decreasing system has heretofore been employed mainly for DRAM. As a down converter for Vext in this case, the following two kinds have been known mainly.

One is a circuit which decreases a voltage through PMOS and a circuit configuration is shown in FIG. 29. The down converter is, hereinafter, referred to as PMOS type. As shown in FIG. 29, the PMOS down converter constitutes a feed-back system and a gate voltage of PMOS (M18) is to be determined according to a value of Vint.

That is, if Vint (a power supply voltage VDD of an internal circuit) is decreased, thus decreased Vint is detected from comparison of a voltage obtained by resistance division of Vint between resistors R15 and R16, with Vref and a gate voltage of the PMOS (M18) is decreased. With the decrease in the gate voltage, Vint is increased. To the contrary, as Vint is increased, a gate voltage of the PMOS is increased and since a supply current is suppressed, an increase in Vint is restricted. Incidentally, C4 is a capacitor for stabilization and C6 is a capacitor for phase compensation in FIG. 29.

The other is a circuit which decreases a voltage through NMOS and a configuration thereof is shown in FIG. 30. The down converter is, hereinafter, referred to as NMOS type. An NMOS down converter does not constitute a feed-back system and a gate voltage of the NMOS (M10) is kept at the sum of Vint (VDD) and a threshold voltage Vt of the NMOS by voltage generating circuit constructed of a voltage limiter 13 and a charge pump circuit 14. If Vint is decreased, a potential difference between the gate and source of the NMOS (M10) is increased and thereby, a supply current is increased, so that Vint is increased. Incidentally, VDDH is an output voltage of voltage generating circuit, CDDH is a capacitor for stabilization of the output voltage and CDD is a capacitor for stabilization of Vint (VDD).

As shown in FIG. 31, in an NMOS down converter, a voltage-decreasing MOS (M10 of FIG. 30) is operated in a sub-threshold region. This is because a fluctuation in internal voltage can be suppressed small even if current consumption of the internal circuit is fluctuated over several orders of magnitude. The sub-threshold region herein means a operating region of a MOS transistor in which a smaller drain current flows compared with in a normal operation in a case where a gate is equal to or lower than a threshold voltage.

Voltages applied to electrodes and a current of a voltage-decreasing NMOS (M10) used in the NMOS down converter of FIG. 30 are shown in FIG. 31A. Vext is applied to the drain of NMOS, Vint to the source thereof and an output voltage VDDH of a voltage generating circuit to the gate thereof. That is, a drain voltage VD=Vext−Vint is applied between the source and drain and a drain current ID flows therethrough. A dependency of the drain current ID on the drain voltage VD is shown in FIG. 31B. The relation can be explained using a mathematical expression as follows.

When a gate voltage of NMOS is denoted by VDDH, a threshold voltage by Vt, an electron charge by q, Boltsmann constant by k, an absolute temperature by T, a drain current ID in the sub-threshold region of NMOS when a drain voltage is VD is expressed with a constant 10 and n in the following way:

$$ID=IO\exp[q(VDDH-Vt-VD)/nkT] \quad (3)$$

As can be understood from the above equation, a change in VD (corresponding to a change in internal power supply voltage Vint) is proportional to a value of log (ID/IO) and is limited to be small even when a supply current ID is changed over several orders of magnitude (see FIG. 31B).

Further, while, as the voltage-decreasing NMOS, a transistor of the same kind as NMOS in use for an ordinary circuit is used, a gate width W of NMOS is required to be very large, for example, 100 mm, since, in the case of the voltage-decreasing NMOS, not only is the operation effected in a sub-threshold region and a large supply current is required to be secured. In the equation (3), increase in a gate width W corresponds with increase in factor IO.

When the NMOS down converter shown in FIG. 30 is used, capacitors for voltage stabilization are required to be connected to terminals of the internal power supply voltage Vint and the gate voltage VDDH of NMOS. A capacitor CDD connected to Vint (VDD) functions to compensate an instantaneous decrease in Vint due to power consumption of a circuit. If CDD is large, a decrease in Vint is small. On the other hand, a capacitor CDDH connected to the gate voltage VDHH of NMOS works for prevention of a fluctuation of the gate voltage from occurring in cooperation with capacitive coupling in a channel section and a capacitance between interconnections.

A magnitude of CDDH is determined in consideration of a response time of a system including a voltage limiter 13 and a charge pump circuit 14. That is, if a time period from when the voltage limiter 13 detects a decrease in VDDH till the charge pump circuit 14 restores a decreased voltage to the original voltage is short, a capacitance of the capacitor CDDH connected to the terminal of VDDH may be small, but if it is long, a large capacitance of CDDH has to be connected in order to compensate a decrease in VDDH during the time period.

While the two kinds of configurations of conventional down converters have been available, some devices are required according to characteristics of both in actual phases. What is especially required to be careful is operations of a down converter in operating modes, stand-by and active, of a semiconductor integrated circuit.

In a stand-by mode, not only current consumption of an internal circuit but also current consumption of the down converter itself are required to be small in order to suppress total current consumption of the entire chip. To the contrary, response of the down converter may be slow.

On the other hand, in an active mode, as the current consumption of the internal circuit is increased, an instantaneous increase/decrease in current consumption is unavoidable in accordance to an operating mode. The down converter is required to function to constantly keep the internal power supply voltage Vint at a prescribed level in a quick response to such an increase/decrease in current consumption.

When the PMOS down converter of FIG. 29 is used, there have been proposed various kinds of systems in which down converters are differently operated according to an active mode or a stand-by mode in order to meet the requirements as described above.

FIG. 32 conceptually shows a configuration in which such different operating modes of down converters are selected. A PMOS down converter which is of low power consumption but slow in response and a PMOS down converter which is of high power consumption, but fast in response constitute a voltage-decreasing system, wherein in a stand-by mode, the PMOS stand-by mode down converter 9*a* which is of low power consumption is only operated according to an enable signal, while in an active mode, the PMOS active mode down converter 9*b* which is fast in response is additionally operated according to an enable signal. In the mean time, in the conventional example shown in FIG. 32, an internal power supply voltage of the stand-by mode down converter and an internal power supply voltage of the active mode down converter are set to the same level.

On the other hand, when the NMOS down converter of FIG. 30 is used, two kinds of circuits are not operated selectively according to the stand-by mode or the active mode. That is, one NMOS down converter is continued to be always operated regardless of the stand-by mode or the active mode. In this case, in order to suppress a stand-by current, it is required to suppress current consumption of voltage generating circuit including the voltage limiter 13 and the charge pump circuit 14.

As a result, while a response speed of a feed-back system including the voltage limiter 13 and the charge pump circuit 14 is lowered, such a lowered response speed is not problematic since a fluctuation in voltage VDDH is small if a value of the capacitance of CDDH for stabilization is set large.

Outlines of the conventional NMOS down converters and the PMOS down converter have been described above. If down converters are selectively operated differently according to the stand-by mode or the active mode in a down converter system, no problems arise in both voltage circuits, as far as a capability and power consumption of each of the down converters are concerned. However, the down converters respectively have problems in circuit design and layout as described below. Then the problems will be described individually.

Since current consumption of a PMOS down converter can be small by using resistors R15 and R16 of high resistance of FIG. 29, the circuit is suitable for a stand-by mode. However, since the circuit constitutes a feed-back system, an internal power supply voltage Vint falls in an oscillating state or a decrease in the voltage occurs if design parameters such as phase compensation of a comparator constituted of a differential amplifier and the like are not correctly estimated. Especially, it is very difficult to design a down converter which is operated in a stand-by mode so that the circuit does not oscillate even when the circuit is operated in an operating mode in which a current is increased by 4 to 5 orders of magnitude.

That is, the PMOS down converter is easier to cause abnormality in an active mode in which increase or decrease in current consumption is more large than in a stand-by mode in which current consumption of an internal circuit is small. In this case, in order to design a feed-back system in a secured manner, it is required that current consumption of an internal circuit in each operating mode is correctly estimated and furthermore, simulations in various conditions are executed deliberately. Accordingly, a PMOS down converter has a high degree of difficulty in design and consumes a long design time compared with an NMOS down converter.

On the other hand, an NMOS down converter is easier to be used than a PMOS down converter in an operating state in which a large current is consumed. However, while the NMOS down converter has an advantage of easy design, it is hard to suppress current consumption of the down converter itself since control is effected by a charge pump circuit.

Further, the NMOS down converter has a disadvantage that the circuit requires a large layout area. That is, the NMOS down converter comprises the following elements:

(1) a capacitor CDD connected to an internal power supply;

(2) a capacitor CDDH connected to VDDH;

(3) a voltage-decreasing NMOS transistor; and (4) VDDH voltage generating circuit (a charge pump circuit and a limiter)

and a layout area for each element is increased in the order from (1) to (4).

Why (1) and (2) occupies larger areas is that the elements each require a capacitance of the order of nanofarads (nF) in order to stabilize a voltage. In the case of DRAM, the capacitors can be constituted of those in the same shape as a memory cell. The capacitors in the same shape as a memory cell are very much small in layout area per a unit capacitance compared with an ordinary MOS capacitor.

Hence, in DRAM, restriction on a layout area caused by the (1) and (2) is comparatively small. However, when an NMOS capacitor is applied to a semiconductor integrated circuit, for example a non-volatile memory, which does not include proper capacitive devices like DRAM, a very large layout area is required compared with the case of DRAM since the capacitors of (1) and (2) are formed by ordinary MOS capacitors.

Further, when the capacitors are formed by MOS capacitors, a capacitor CDD of (1) is not problematic in reliability of an oxide film since a potential difference applied to both ends of an oxide film is of the order of an internal power supply voltage Vint (VDD), but a capacitor CDDH of (2) cannot use a MOS capacitor for CDD as it is from the viewpoint of reliability since a potential difference between both ends of an oxide film is large: VDDH=VDD+Vt (Vt is a threshold voltage of a voltage-decreasing NMOS).

Hence, as a capacitor CDDH of (2), a MOS capacitor, whose oxide film is thick, and whose breakdown voltage is large, has to be adopted and therefore, a layout area for a capacitor is further increased.

Besides, in the NMOS down converter shown in FIG. 30, Vint (VDD) which is generated in the source of a voltage-decreasing NMOS transistor (M10) is supplied to peripheral circuits blocks. At this point, if a distance between the voltage-decreasing NMOS (M10) and the peripheral circuit blocks are too much, interconnection therebetween is a cause to provide unintentional parasitic resistance. In a down converter, control is effected so that the source of a voltage-decreasing NMOS (M10) is at a constant voltage and therefore, VDD is decreased due to the parasitic resistance in the peripheral circuit block.

Further, in an NMOS down converter, though it is preferable that a uniform operation is effected over the whole of a large gate width of the voltage-decreasing NMOS (M10), if a layout area of the voltage-decreasing NMOS is too large, a part of the gate width W has a chance to get early operated compared with the other parts due to a parasitic resistance of interconnection which is connected with the voltage-decreasing NMOS (M10). Therefore, it is required that a layout area of the NMOS down converter is contracted and thereby the length of interconnection is suppressed, as a result decreasing parasitic resistance of interconnection.

However, in a memory such as a NAND flash memory (a batch-erasable memory), there is an operation in which a very large capacitance including those of word lines, a power supply node in a sense amplifier is charged in one time and at this operation, a large current flows locally. For example, in data write, a current which charges word line capacitance of the order of 60 nF flows in a wordline driver circuit in a concentrated manner. In order to suppress a fluctuation in operation of a voltage-decreasing NMOS (M10) due to such a transient large current, it is required to connect a stabilization capacitor CDD with a large capacitance to an internal power supply voltage Vint (VDD) as described above and therefore, it is not easy to contract a layout area for the NMOS down converter.

Besides, in a non-volatile memory, since a high voltage for write and erase is used in the chip, there is a possibility to use not only an internal power supply voltage Vint, which is decreased in an internal circuit, but also part of an external power supply voltage Vext in peripheral circuits. For this reason, a further restriction on layout arises in the NMOS down converter.

For example, since a high breakdown voltage transistor with a thick gate oxide film is used for a charge pump circuit 14 shown in FIG. 30, a power supply voltage of the charge pump circuit 14 is not necessarily a decreased power supply voltage Vint. In addition, the charge pump circuit 14 has large current consumption since the circuit charges a comparatively large capacitance including a word line, a well and the like. When a decreased voltage Vint is used for a power supply voltage of the charge pump circuit 14, a power supply voltage Vint (VDD) of an internal circuit has a possibility to be unstable by receiving an influence of a large charge current since the current is supplied through the voltage-decreasing NMOS (M10).

On the other hand, when an external power supply voltage Vext is used in the charge pump circuit 14, a circuit is required which switches Vext and Vint as a peripheral circuit to control the charge pump circuit 14 and both of Vext and Vint are required to be supplied to a peripheral circuit block. In such a manner, when a plurality of power supply circuits coexists in the peripheral circuit block, there is a necessity that an internal power supply voltage Vint which is supplied from a down converter and an external power supply voltage Vext which is applied to the down converter are both interconnected to the peripheral circuit block, which makes overlap of power supply lines large.

In FIG. 33, there is shown an example of a layout of a conventional semiconductor integrated circuit: that is a memory, provided with a cell array 37; a down converter 38; a peripheral circuit block 39 on a semiconductor chip 36. Since it is a precondition that a power supply interconnection to the peripheral circuit block 39 is usually limited for Vint (VDD), if an external power supply voltage Vext is used in the peripheral circuit block 39, an interconnection for Vext has required to be laid down in excess, thus producing an overhead of a layout area.

Further, in the conventional layout shown in FIG. 33, there arises a necessity for irregular power supply interconnection to lead out Vint (VDD) to the peripheral circuit block 39 from a voltage-decreasing NMOS included in the down converter 38. When the interconnection is long, an unintentional parasitic resistance is added to the source of the voltage-decreasing NMOS.

Since the down converter shown in FIG. 30 performs control so that the source voltage of the voltage-decreasing NMOS (M10) is constant, an exact control cannot be performed if a resistance is added to the source. As described above, in a layout method for a conventional NMOS down converter on a chip of a semiconductor integrated circuit, there has been a problem of increase in area due to extended inter-connection and a problem of control of a power supply voltage accompanying with the increase in area.

As described above, there has been a problem that in an internal power supply of a conventional semiconductor integrated circuit, when the power supply voltage is temporarily decreased due to a power consumption of internal circuit, the power supply voltage detecting circuit detects the decrease and resets latches erroneously.

Further, there has been another problem that in power supply circuit of a down converter system provided with down converters, in a stand-by mode and an active mode, when transition is effected from the stand-by mode with low power consumption to the active mode with high power consumption, a temporary decrease in internal power supply voltage is hard to suppress.

BRIEF SUMMARY OF THE INVENTION

There has been many problems associated with designing and a layout area of NMOS and PMOS down converters employed in a conventional semiconductor integrated circuit of a multiple power supply type and it has been difficult not only to meet requirements in miniaturization and realization of higher integration for both down converters but to obtain a semiconductor integrated circuit of a multiple power supply type which operates according to the design using both down converters.

The present invention has been made in order to solve the above described problems and accordingly, it is an object of the present invention to provide a power supply voltage detecting circuit which will not make a latch malfunction even if an internal power supply voltage changes temporarily and provide down converters respectively in stand-by and active modes which suppress decrease in internal supply voltage in transition from the stand-by mode to the active mode, whose layout require small areas, and which can be designed with ease.

A semiconductor integrated circuit of the present invention is characterized by that there is provided a power supply voltage detecting circuit which avoids malfunction when a temporary change in power supply voltage occurs, by changing a detecting level according to increase or decrease in power supply voltage.

A semiconductor integrated circuit of the present invention which uses a PMOS down converter in a stand-by mode and an NMOS down converter in an active mode is characterized in that the decrease in internal power supply voltage immediately after a transition from the stand-by mode to the active mode occurs is suppressed by setting the internal power supply voltage in the stand-by mode higher than in the active mode.

A semiconductor integrated circuit of the present invention is characterized in that a down converter is formed in a lower layer of an external power supply interconnection. Peripheral circuit blocks to which a decreased internal power supply voltage is supplied are formed in a lower layer of internal interconnection adjacent to both sides of the external power supply interconnection. Thereby, a distance between the down converter and the peripheral circuit blocks to which the internal supply voltage is supplied is minimized and further a decrease in voltage due to an interconnection resistance is avoided.

In a concrete manner of description, according to a first aspect of the present invention, there is provided a semiconductor integrated circuit comprising a power supply voltage detecting circuit which, when a power supply voltage is higher than a first voltage, outputs a high level voltage, and when the power supply voltage is lower than the first voltage, outputs a low level voltage; and a detection signal output circuit which receives the output voltages of the power supply voltage detecting circuit, and outputs a first detection signal when the power supply voltage is increased to be equal to or higher than the first voltage, and a second detection signal when the power supply voltage is decreased to a second voltage lower than the first voltage.

In the semiconductor integrated circuit according to the first aspect of the present invention, the detection signal output circuit may comprise a Schmitt trigger circuit.

According to a second aspect of the present invention, there is provided a semiconductor integrated circuit comprising a first power supply voltage detecting circuit which, when a power supply voltage is higher than a first voltage, outputs a high level voltage, and when the power supply voltage is lower than the first voltage, outputs a low level voltage; and a second power supply voltage detecting circuit which, when the power supply voltage is higher than a second voltage, outputs a high level voltage, and when the power supply voltage is lower than the second voltage, outputs a low level voltage; and a detection signal output circuit which receives voltages of the output levels of the first and second power supply voltage detecting circuits, and outputs a first detection signal when the power supply voltage is increased to be equal to or higher than the first voltage, and a second detection signal when the power supply voltage is decreased to be equal to or lower than the second voltage which is higher than the first voltage.

In the semiconductor integrated circuit according to the second aspect of the present invention, the detection signal output circuit may comprise a flip-flop circuit to which the voltages of the output levels of the first and second power supply voltage detecting circuits are input.

According to a third aspect of the present invention, there is provided a semiconductor integrated circuit in which an external power supply voltage supplied externally is decreased and an internal power supply voltage for driving an internal circuit is generated, comprising an external power supply voltage detecting circuit which detects the external power supply voltage; and an internal power supply voltage detecting circuit which detects the internal power supply voltage, wherein the internal power supply voltage detecting circuit is comprised of a power supply voltage detecting circuit which, when the internal power supply voltage is increased to be equal to or higher than a first voltage, outputs a first detection signal, and when the power supply voltage is decreased to be equal to or lower than a second voltage which is lower than the first voltage, outputs a second detection signal.

According to a fourth aspect of the present invention, there is provided a semiconductor integrated circuit in which an external power supply voltage supplied externally is decreased and an internal power supply voltage for driving an internal circuit is generated, comprising an external power supply voltage detecting circuit which detects the external power supply voltage; and an internal power supply voltage detecting circuit which detects the internal power supply voltage, wherein the external power supply voltage detecting circuit and the internal power supply voltage detecting circuit have respective power supply voltage detection levels different from each other.

According to a fifth aspect of the present invention, there is provided a semiconductor integrated circuit in which an external power supply voltage supplied externally is decreased and an internal power supply voltage for driving an internal circuit is generated, wherein the internal power supply voltage is set to a first voltage in a stand-by mode of the semiconductor integrated circuit and a second voltage in an active mode of the semiconductor integrated circuit, and wherein the first voltage in the stand-by mode is set higher than the second voltage in the active mode.

According to a sixth aspect of the present invention, there is provided a semiconductor integrated circuit in which an external power supply voltage supplied externally is generated and an internal power supply voltage for driving an internal circuit is generated, comprising a stand-by mode down converter; a voltage switching circuit for the stand-by mode down converter; an active mode down converter; an enable signal generating section which makes the active mode down converter to be an enable state; and a stabilization capacitor which stabilizes the internal power supply voltage, wherein an output terminal of the enable signal generating section is connected to the active mode down converter and the voltage switching circuit in parallel, and wherein an internal power supply voltage in an stand-by mode is set higher than an internal power supply voltage in an active mode.

In the semiconductor integrated circuit according to the sixth aspect of the present invention, when a time period from when an enable signal is output from the enable signal generating section till the active mode down converter reaches an operating state is denoted by Tact, an average current of the internal circuit during the time period Tact by Iint, a capacitance of a stabilization capacitor by C, an internal power supply voltage in a stand-by mode by Vstby and an internal power supply voltage in an active mode by Vint, a relation of $C \times (Vstby - Vint)/Tact > Iint$ may be established.

According to a seventh aspect of the present invention, there is provided a semiconductor integrated circuit in which an external power supply voltage supplied externally is decreased and an internal power supply voltage for driving an internal circuit is generated, comprising a stand-by mode down converter; and an active mode down converter which constitutes together with the stand-by mode down converter a down converter for the external power supply voltage, wherein the stand-by mode down converter includes a comparator of a differential amplification type to one of whose input terminals a reference voltage is input; a P channel transistor, whose source is connected to an external power supply line which supplies the external power supply voltage, whose gate is connected to an output terminal of the comparator, and whose drain is connected to an internal power supply line which supplies the internal power supply voltage; and a resistance voltage divider which divides a voltage of the drain over resistance values of resistors and inputs a divided voltage to the other of the input terminals of the comparator, and wherein the active mode down converter includes a voltage generating circuit; and an N channel transistor, whose drain is connected to the external power supply line which supplies the external power supply voltage, whose gate is connected to an output terminal of the voltage generating circuit, and whose source is connected to the internal power supply line which supplies the internal power supply voltage.

In the semiconductor integrated circuit according to the seventh aspect of the present invention, the voltage generating circuit may include a charge pump circuit and a voltage limiter. In the semiconductor integrated circuit, the voltage generating circuit may include a resistor which is connected between an output terminal of the charge pump circuit and an input terminal of the voltage limiter.

In the semiconductor integrated circuit according to the seventh aspect of the present invention, the voltage generating circuit may include a comparator of a differential amplification type to one of whose input terminals a reference voltage is input; a P channel transistor, whose source is connected to the external power supply line which supplies the external power supply voltage, whose gate is connected to an output terminal of the comparator, and whose drain is an output terminal; and a resistance voltage divider which divides a voltage of the drain over resistance values of resistors and inputs a divided voltage to the other of the input terminals of the comparator.

In the semiconductor integrated circuit according to the seventh aspect of the present invention, the semiconductor integrated circuit may further comprise a rectifying element inserted between the output terminal of the voltage generating circuit and the external power supply line which supplies the external power supply voltage, the rectifying element for allowing a current to flow in a direction from a terminal of the external power supply voltage to the output terminal of the voltage generating circuit.

In the semiconductor integrated circuit according to the seventh aspect of the present invention, the semiconductor integrated circuit may further comprise a stabilization capacitor for an output voltage connected to the output terminal of the voltage generating circuit, a capacitance of the stabilization capacitor being smaller than a gate capacitance of the N channel transistor.

In the semiconductor integrated circuit according to the seventh aspect of the present invention, the semiconductor integrated circuit may further comprise a P channel transistor, a source of the P channel transistor being connected to the external power supply line which supplies the external power supply voltage and a drain thereof being connected to the internal power supply line which supplies the internal power supply voltage, and a charging accelerating circuit for accelerating charging of the internal power supply line by holding the P channel transistor in an ON state during a time period from when an external power supply voltage is applied till an internal power supply voltage reaches a prescribed voltage lower than a target value.

According to an eighth aspect of the present invention, there is provided a semiconductor integrated circuit comprising a down converter which generates an internal power supply voltage on a semiconductor chip from an external power supply voltage which is supplied from the outside of the semiconductor chip; and a charge pump circuit which generates a boosted voltage on the semiconductor chip from the external power supply voltage.

According to a ninth aspect of the present invention, there is provided a semiconductor integrated circuit comprising a down converter which generates an internal power supply voltage on a semiconductor chip from an external power supply voltage which is supplied from the outside of the semiconductor chip; and an external power supply line which supplies the external power supply voltage and an internal power supply line which supplies the internal power supply voltage, wherein the external power supply line and the internal power supply line are arranged in parallel to each other on the semiconductor chip, and wherein the down converter is arranged in a lower layer of the external power supply line, whereby the internal power supply voltage which is generated in the down converter is supplied to a peripheral circuit block adjacent to the down converter.

According to a tenth aspect of the present invention, there is provided a semiconductor integrated circuit comprising a down converter which generates an internal power supply voltage on a semiconductor chip from an external power supply voltage supplied from the outside of the semiconductor chip; and an external power supply line which supplies the external power supply voltage and an internal power supply line which supplies the internal power supply voltage, the external power supply line and the internal power supply line being arranged on the semiconductor chip, wherein the down converter is arranged in a lower layer of the external power supply line, and wherein a connection lead section of the external power supply line and the internal power supply line are arranged in a superposing manner, whereby the external power supply voltage and the internal power supply voltage are supplied to a peripheral circuit block adjacent to the down converter.

According to an eleventh aspect of the present invention, there is provided a semiconductor integrated circuit comprising a down converter on a semiconductor chip, which generates an internal power supply voltage from an external power supply voltage supplied from the outside of the semiconductor chip; an external power supply line which supplies the external power supply voltage, the external power supply line and the down converter which is formed in a lower layer of the external power supply line being both formed in a region of the semiconductor chip, which region extends in a direction; a peripheral circuit to which the internal power supply voltage is supplied from the down converter constructed of at least two peripheral circuit blocks which are symmetrically arranged on both sides of the region extending in the direction, and an internal power supply line which supplies the external power supply voltage, wherein the internal power supply line and the at least two peripheral circuit blocks to which blocks the internal power supply voltage is supplied are arranged so as to be adjacent to the region extending in the direction, and wherein the internal power supply voltage is supplied to the at least two peripheral circuit blocks by way of the internal power supply line.

According to a twelfth aspect of the present invention, there is provided a semiconductor integrated circuit comprising a first power supply voltage detecting circuit which, when a power supply voltage is higher than a first voltage, outputs a high level voltage, and when the power supply voltage is lower than the first voltage, outputs a low level voltage; and a second power supply voltage detecting circuit which when the power supply voltage is higher than a second voltage, outputs a high level voltage, and when the power supply voltage is lower than the second voltage, outputs a low level voltage; and a detection signal output circuit which receives voltages of the output levels of the first and second power supply voltage detecting circuits, and outputs a first detection signal when the power supply voltage is increased to be equal to or higher than the first voltage, and a second detection signal when the power supply voltage is decreased to be equal to or lower than the second voltage which is lower than the first voltage.

In the semiconductor integrated circuit according to the twelfth aspect of the present invention, the detection signal output circuit may comprise a flip-flop circuit to which the voltages of the output levels of the first and second power supply voltage detecting circuits are input.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 31A and 31B are a diagram and a graph showing a sub-threshold characteristic of a voltage decreasing NMOS.

FIG. 32 is a block diagram showing a configuration of conventional stand-by/active mode down converter.

FIG. 33 is a conceptual plan view showing a layout of a conventional semiconductor integrated circuit.

DETAILED DESCRIPTION OF THE INVENTION

Figure 1:
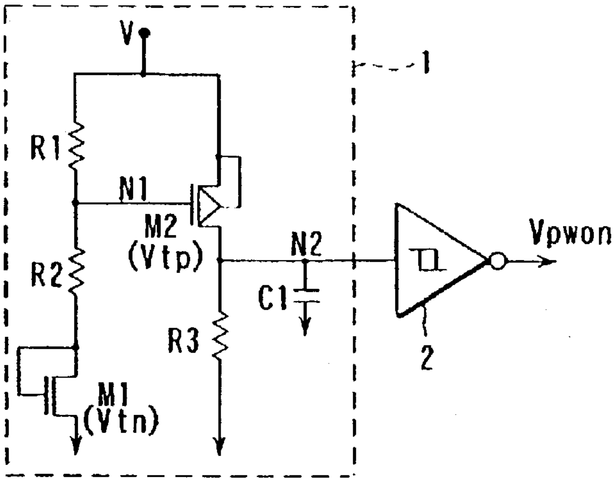
FIG. 1 is a diagram showing a configuration of a power supply voltage detecting circuit of a first embodiment of the present invention.

Embodiments of the present invention will below be detailed with reference to the accompanying drawings. FIG. 1 is a diagram showing a configuration of a power supply voltage detecting circuit of a first embodiment of the present invention. A power supply voltage detecting circuit of the first embodiment is provided with different voltage detection levels respectively in increase and decrease in voltage so that, when a power supply voltage level is temporarily decreased, the power supply voltage detecting circuit does not reset a latch even if the circuit detects the temporary decrease in the power supply voltage.

Such a power supply voltage detecting circuit as meets the above described performance can be realized in several methods. The easiest and most simple method among them is shown in FIG. 1. The power supply voltage detecting circuit of FIG. 1 comprises: a power supply voltage detecting section 1 including serially connected resistors R1 and R2 one of whose terminals is connected to a power supply and the other of whose terminals is connected to the drain of NMOS (M1) connected as a diode; PMOS (M2) whose source is connected to the power supply and whose drain is an output end; a resistor R3 which is connected to between the drain and ground; and a stabilization capacitor C1 which is connected to between the drain and ground in parallel to the resistor R3; and a Schmitt trigger circuit 2.

Incidentally, in the power supply voltage detecting circuit of FIG. 1, the source of NMOS (M1) is grounded and there are provided a node N1 which connects an intermediate terminal of the serially connected resistors R1 and R2 and the gate of PMOS (M2) with each other and a node N2 which connects the drain of PMOS (M2) and the input terminal of the Schmitt trigger circuit 2 with each other. A power-on signal Vpwon is output from the output terminal of the Schmitt trigger circuit 2.

Figure 2A:
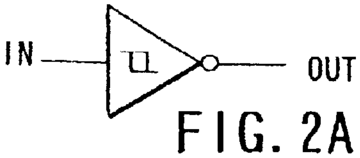
FIGS. 2A and 2B are an illustration and a graph showing a hysteresis characteristic of a Schmitt trigger circuit.
Figure 2B:
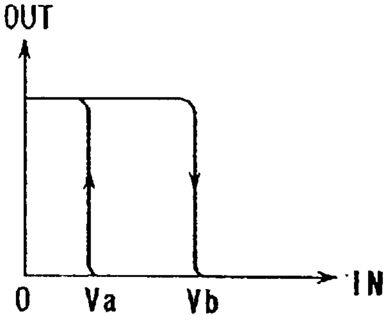
Figure 27:
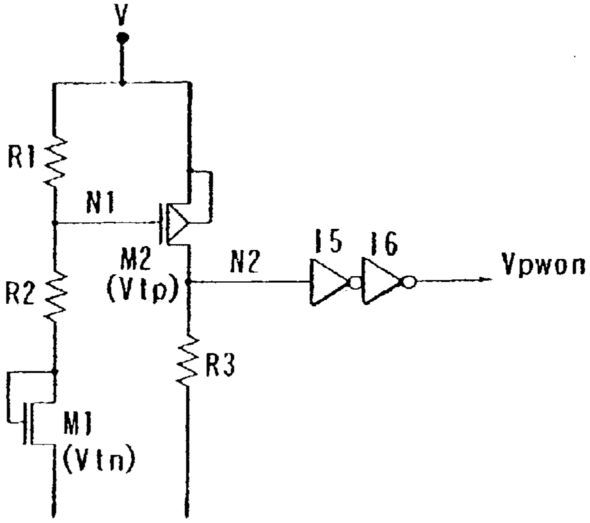
FIG. 27 (PRIOR ART)
FIG. 27 is a diagram showing a configuration of a conventional power supply voltage detecting circuit.
Figure 28:
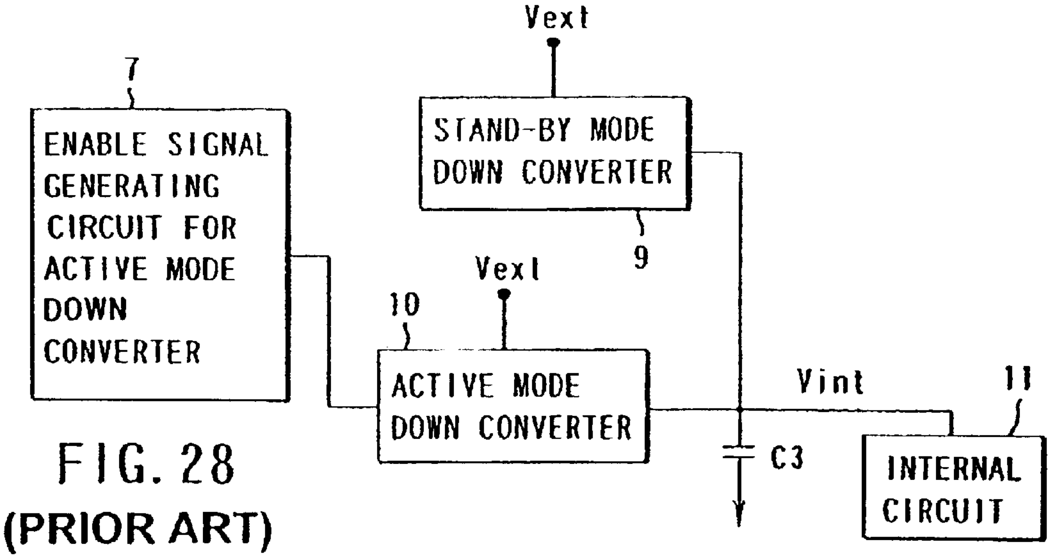
FIG. 28 (PRIOR ART)
FIG. 28 is a block diagram showing a configuration of a conventional down converter.

Since a circuit configuration of the power supply voltage detecting section 1 of FIG. 1 is same as that of the power supply voltage detecting circuit of FIG. 27 except for a stabilization capacitor C1, and inverters 15 and 16, detailed description of a circuit operation of the power supply voltage detecting section is omitted. Input/output terminals IN and OUT of the Schmitt trigger circuit are shown in FIG. 2A and an input/output characteristic of the Schmitt trigger circuit are shown in FIG. 2B.

As described above, the node N2 goes "H" or "L" according to whether a power supply voltage V is higher or lower than Vdetect. While, when the power supply voltage V is increased, a power-on signal is generated at the level of Vpwon (Vb of FIG. 2B) since a voltage of the node N2 is input to the Schmitt trigger circuit which has an input/output characteristic in the form of a hysteresis as shown in FIG. 2B, when the power supply voltage V is decreased, a signal is not generated even if the power supply V is decreased to Vpwon since a detection level of the Schmitt trigger circuit is lowered (Va of FIG. 2B).

When the power supply voltage is decreased, if the power supply voltage V is decreased to a value lower than Vdetect, thereby, PMOS (M2) becomes the OFF state and in succession, a voltage of the node N2 is very rapidly decreased to Va, the Schmitt trigger circuit 2 generates a detection signal, which makes a change in detection level meaningless. In order to avoid this, a capacitor C1 with a sufficiently large capacitance is connected to the node N2. With the capacitor C1, a voltage of the node N2 is maintained due to a delay time of C1×R3 and the power supply voltage is decreased before the voltage of the node N2 is decreased, so that the Schmitt trigger circuit 2 never generates a detection signal.

Then, a power supply voltage detecting circuit according to a second embodiment of the present invention will be described based on FIGS. 3 and 4. In the first embodiment, description is made on a power supply voltage detecting circuit which is designed so as not to generate a signal in a substantial sense when the power supply voltage is decreased, but in the second embodiment shown in FIG. 3, description will be made on a power supply detecting circuit in which signals are generated both in increase and decrease in the power supply voltage and a detection level in the increase is set to higher than that in the decrease.

Figure 3:
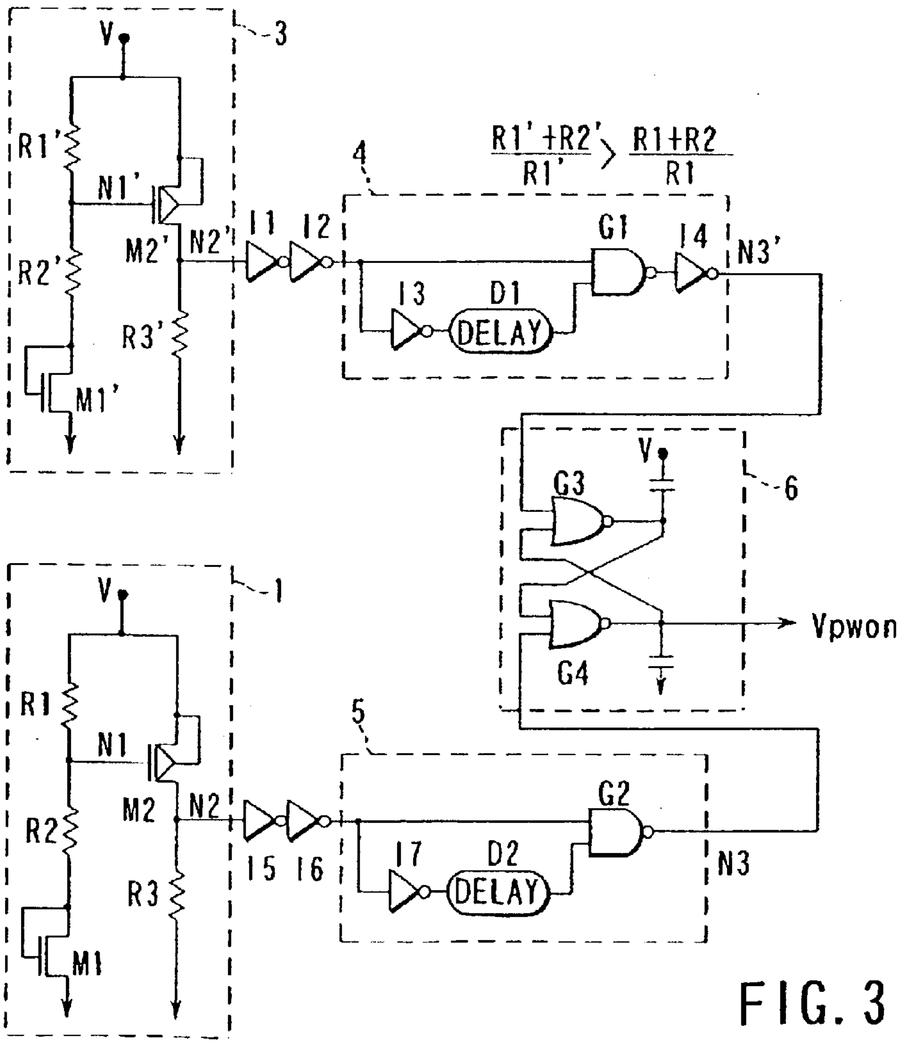
FIG. 3 is a diagram showing a configuration of a power supply voltage detecting circuit of a second embodiment of the present invention.

The power supply voltage detecting circuit shown in FIG. 3 has a similar configuration of the power supply voltage detecting circuit in FIG. 1 and comprises: a first power supply voltage detecting section 1 including NMOS (M1), PMOS (M2), resistors R1, R2 and R3 and nodes N1 and N2; a second power supply voltage detecting section 3 including NMOS (M1'), PMOS (M2'), resistors R1', R2' and R3' and nodes N1' and N2'; an increase signal detecting circuit 4 including a NAND gate G1, a delay (delay circuit) D1, and inverters 13 and 14; a decrease signal detecting circuit 5 including a NAND gate G2, a delay (delay circuit) D2, and an inverter 17; and a flip-flop 6 including NOR gates G3 and G4.

Incidentally, the first power supply voltage detecting section 1 and the decrease signal detecting circuit 5 are connected to each other through the inverters 15 and 16 and the decrease signal detecting circuit 5 is provided with a node N3 which is an output section. Further, the second power supply voltage detecting section 3 and the increase signal detecting circuit 4 are connected to each other through inverters I1 and I2 and the increase signal detecting circuit 4 is provided with a node N3' which is an output section.

As described above, the first power supply voltage detecting section 1 shown in FIG. 3 is a circuit a potential of whose node N2 goes "H" if the power supply voltage is higher than V1 which is given by $$V1=Vtn+(R1+R2)\times|Vtp|/R1, \tag{4}$$

where Vtn and Vtp are respectively threshold voltages of NMOS (M1) and PMOS (M2).

Like this, the second power supply voltage detecting section 3 is a circuit a potential of whose N2' goes "H" if the power supply voltage is higher than V2 which is given by $$V2=Vtn+(R1'+R2')\times|Vtp|/R2' \tag{5}$$

Values of resistance of the resistors R, R2 and R1', R2' are set so as to be V2>V1.

Operations of a power supply voltage detecting circuit shown in FIG. 3 will be described using a timing chart of FIG. 4.

Figure 4:
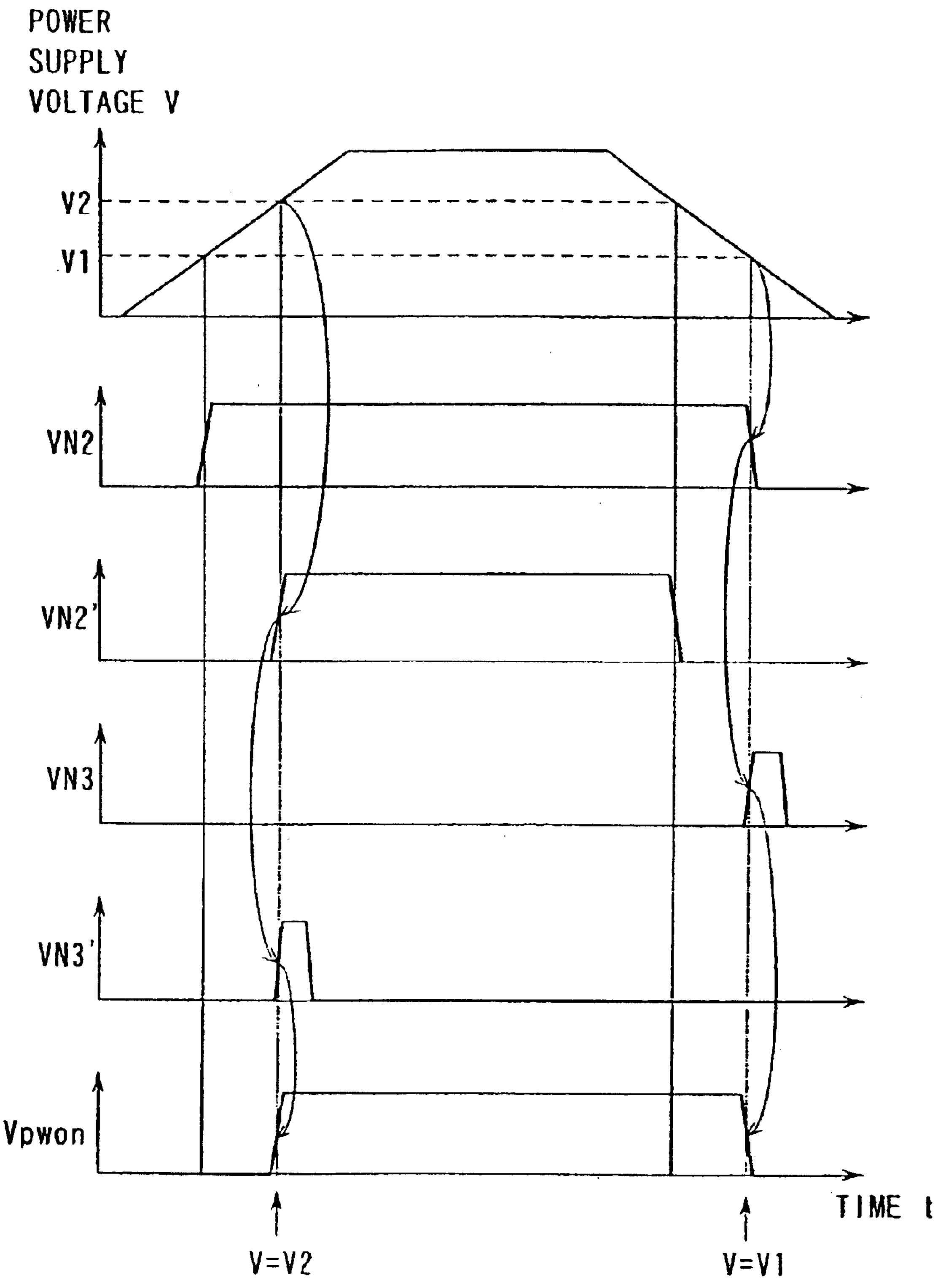
FIG. 4 is a timing chart showing operations of a power supply voltage detecting circuit of the second embodiment of the present invention.

Time dependence of the power supply voltage V is shown in the uppermost chart of FIG. 4. In an increase region of the power supply voltage V, if V goes higher than V1, a voltage VN2 of the node N2 in the first power supply voltage detecting section 1 goes "H" as shown in the second highest chart. If V goes higher than V2, a voltage VN2' of the node N2' of the second power supply voltage detecting circuit 3 goes "H" as shown in the third highest chart.

VN2 is transferred to the decrease signal detecting circuit 5 through the inverters I5 and I6 and input to one of the input terminals of a NAND gate G2. Further VN2 is branched away to an inverter I7 and delay D2 and input to the other input terminal of the NAND gate G2. Accordingly, one of the two inputs of the NAND gate G2 goes "H" and, as shown in the fourth highest chart, no increase in VN2 is detected and a "L" state is maintained in a voltage VN3 of the node N3 in the output section of the decrease signal detecting circuit 5.

On the other hand, VN2' is transferred to the increase signal detecting circuit 4 through the inverters I1 and I2 and input to one of the input terminals of a NAND gate G1. Further VN2' is branched away to an inverter I3 and delay D1 and input to the other of the input terminal of the NAND gate G1. Accordingly, the two inputs of the NAND gate G1 are kept "H" during a delay time of the delay D1 only and, as shown in the fifth highest chart, a voltage VN3' of the node N3' in the output section of the increase signal detecting circuit 4 generates an increase signal detection pulse with a pulse width equal to the delay time at a point in time when V=V2.

Then, if V is lower than V2 in the decrease region of the power supply voltage V, a voltage VN2' of the node N2' of the second power supply voltage detecting section 3 inverts from "H" to "L" as shown in the third highest chart. If V is lower than V1, a voltage VN2 of the node N2 in the first power supply voltage detecting section 1 inverts from "H" to "L" as shown in the second highest chart.

VN2" is transferred to the increase signal detecting circuit 4 through the inverters I1 and I2 and input to one of the terminals of the NAND gate G1. Further, VN2' is branched away to the inverter I3 and the delay D1 and input to the other of the input terminals of the NAND gate G1. Accordingly, one of the two inputs of the NAND gate G2 goes “H” or both of the two inputs go “L” and, as shown in the fifth highest chart, no decrease in VN2' is detected and a “L” state is maintained in a voltage VN3' of the node N3' in the output section of the increase signal detecting circuit 4.

On the other hand, VN2 is transferred to the decrease signal detecting circuit 5 through the inverters I5 and I6 and input to one of the input terminals of the NAND gate G2. Further, VN2 branches away to the inverter I7 and the delay D2 and input to the other of the input terminals of the NAND gate G2. Accordingly the two input of the NAND gate G2 is kept at “L” during the delay time of the delay D2 only and, as shown in the fourth highest chart, a voltage VN3 of the node N3 in the output section of the decrease signal detecting circuit 5 generates a decrease signal detection pulse with a pulse width equal to the delay time at a point in time when V=V1.

In such a manner, when the power supply voltage V is increased to be higher than V2 and when the power supply voltage V is decreased to be lower than V1, increase and decrease signal detection pulses are respectively generated by the increase signal detecting circuit 4 and the decrease signal detecting circuit 5.

If the pulses are input to the flip-flop 6, the power supply voltage detecting circuit of FIG. 3 outputs a power-on signal Vpwon which keeps “H” during the time from when the power supply voltage V exceeds V2 till being decreased to be lower than V1, as shown in the lowest chart of FIG. 4.

A power supply voltage detecting circuit of the second embodiment has an advantageous point that detection levels in the increase and decrease are freely changed as far as V2>V1 by changing resistance values of the resistors R1, R2, R1' and R2' as seen from the equations (4) and (5), and an inequality shown in the top right side of FIG. 3.

Then, a power supply voltage detecting circuit according to a third embodiment of the present invention will be described based on FIGS. 5 and 6. The third embodiment is a modification example of the second embodiment and a power supply voltage detecting circuit in which signals are generated both in the increase and decrease in the power supply voltage and in addition, a detection level in the increase is set higher than that in the decrease like the second embodiment in term of functionality.

Figure 5:
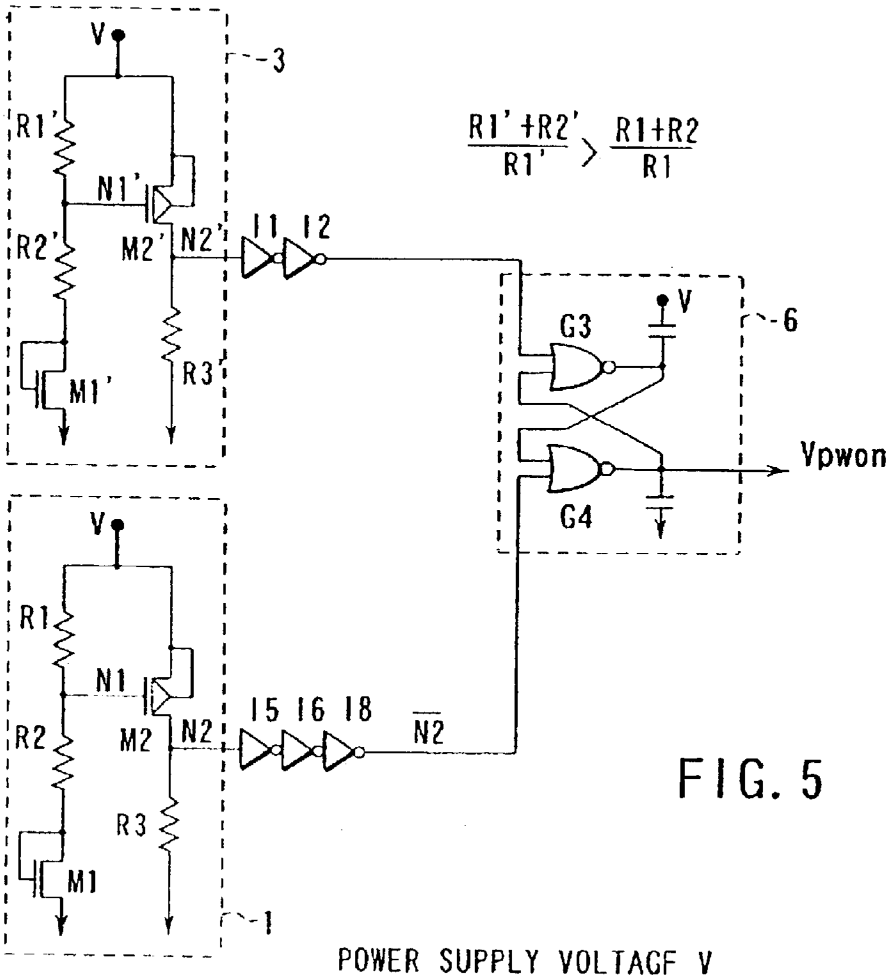
FIG. 5 is a diagram showing a configuration of a power supply voltage detecting circuit of a third embodiment of the present invention.

As shown in FIG. 5, the power supply voltage detecting circuit of the third embodiment is different from the second embodiment in that the increase signal detecting circuit 4 and the decrease signal detecting circuit 5 are both removed compared with the second embodiment and an inverter 18 is added in an output section of a power supply voltage detecting section 1. Accordingly, VN2' and /VN2 which is obtained by inverting VN2' with the inverter 18 are input to input terminals of the flip-flop 6.

Figure 6:
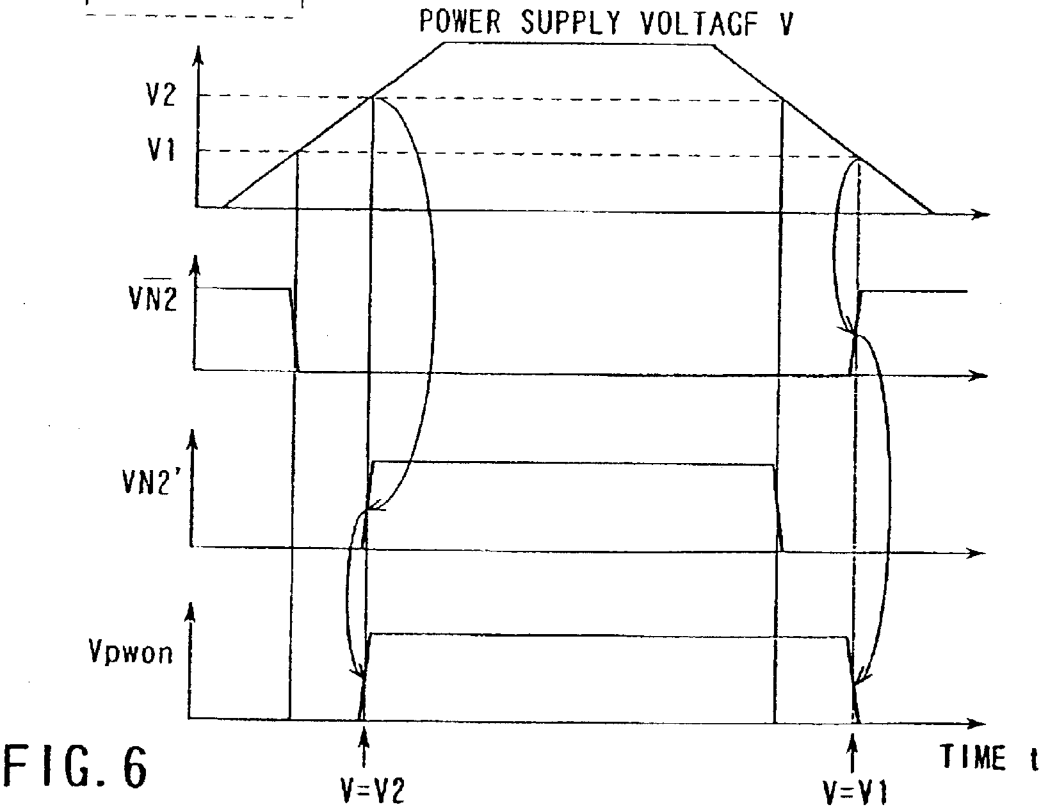
FIG. 6 is a timing chart showing operations of a power supply voltage detecting circuit of the third embodiment of the present invention.

FIG. 6 is a timing chart showing operations of the power supply voltage detecting circuit of the third embodiment. If the circuit configuration of FIG. 5 is employed, a power-on signal Vpwon which is absolutely same as that of FIG. 4 can be output in the increase and decrease in the power supply voltage.

Further, there is available an advantage that detection levels in the increase and decrease can freely be changed as far as V2>V1 by changing resistance values of the resistors R1, R2, R1' and R2' as shown in the inequality in the top right side of FIG. 5. Incidentally, since operations of constituents are similar to those of the second embodiment, descriptions thereof are omitted.

The power supply voltage detecting circuit of the third embodiment is simple in circuit configuration compared with the second embodiment since the increase and decrease signal detecting circuits described in the second embodiment are omitted, whereas the second embodiment is superior to the third embodiment in terms of sureness of operations.

Figure 7:
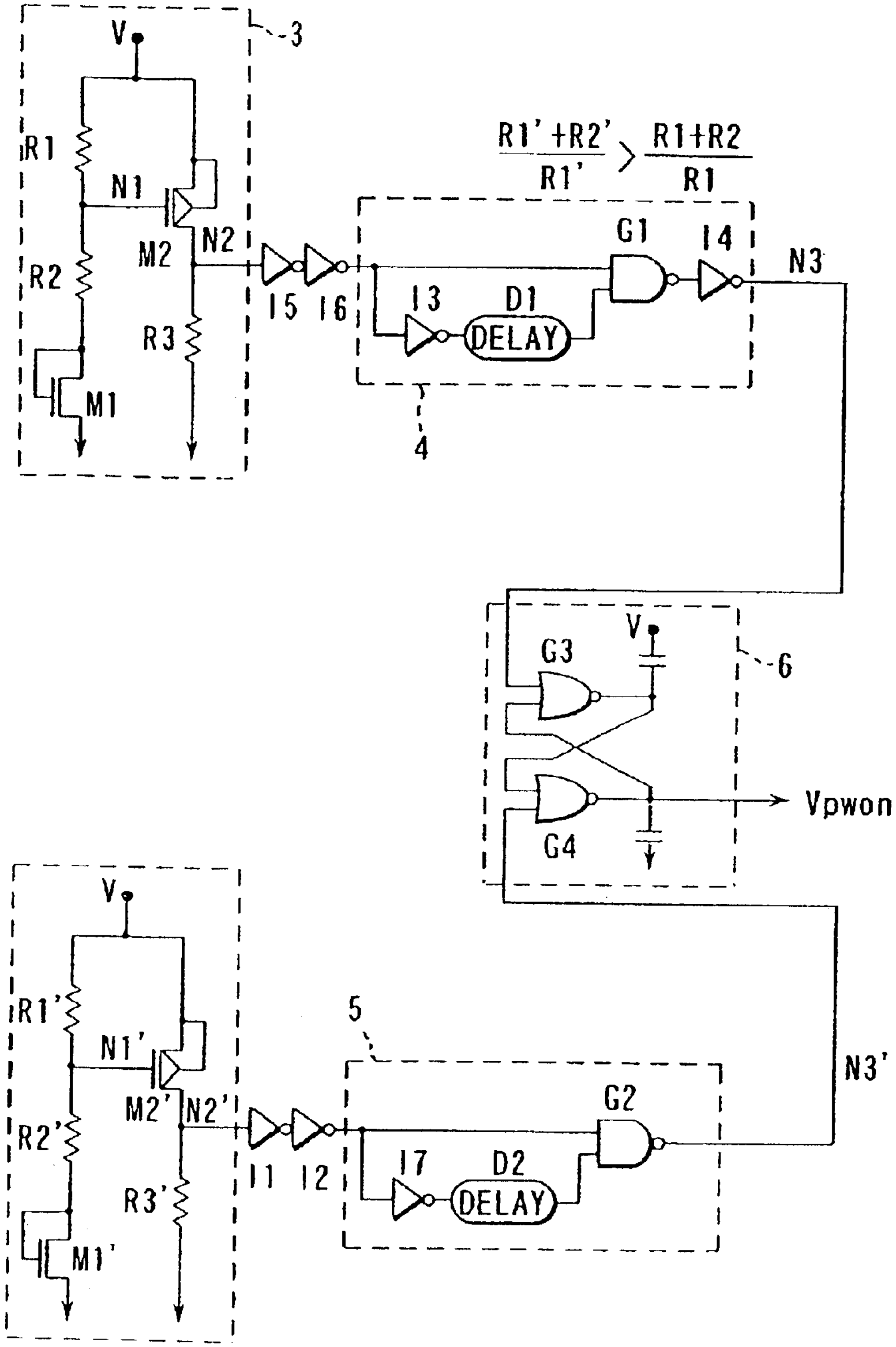
FIG. 7 is a diagram showing a configuration of a power supply voltage detecting circuit of a fourth embodiment of the present invention.

Then, a power supply voltage detecting circuit according to a fourth embodiment of the present invention will be described based on FIGS. 7 and 8. The fourth embodiment is a modification example of the second embodiment and a power supply voltage detecting circuit in which signals is generated both in increase and decrease in the power supply voltage and a detection level in the decrease is set higher than that in the increase, which is different from the second embodiment.

The fourth embodiment is different from the second embodiment compared therewith in that a first power supply voltage detecting circuit 1 in which if the power supply voltage goes higher than V1, a potential of the node N2 goes “H” and an increase signal detecting circuit 4 are connected with each other through two inverters I5 and I6; and further, a second power supply voltage detecting section 3 in which if the power supply voltage is higher than V2 (V2>V1), a potential of a node N2' goes “H” and a decrease signal detecting circuit 5 is connected with each other through two inverters cascaded 11 an 12.

Figure 8:
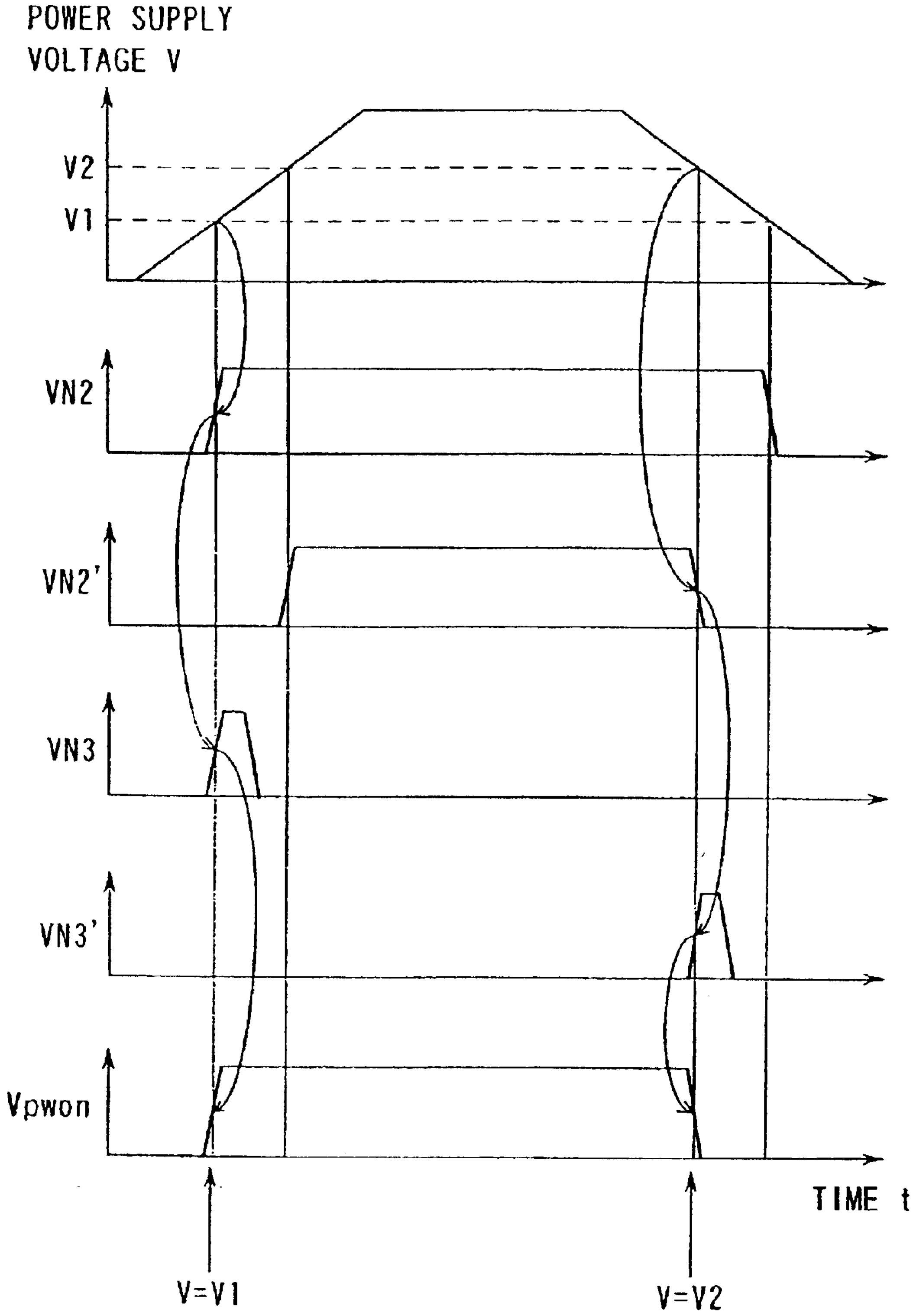
FIG. 8 is a timing chart showing operations of a power supply voltage detecting circuit of the fourth embodiment of the present invention.

FIG. 8 is a timing chart showing operations of a power supply voltage detecting circuit in the fourth embodiment. Since a first power supply voltage detecting section 1 whose detection level (V1) is low is connected to an increase signal detecting circuit 4, an increase signal detection pulse is generated at a point in time when V=V1 in VN3 of the fourth highest chart VN3, while since a second power supply voltage detecting circuit 3 whose detection level (V2) is high is connected to a decrease signal detecting circuit 5, a decrease signal detection pulse is generated in VN3' of the fifth highest chart at a point in time when V=V2 (V2>V1).

Accordingly, as shown in the lowest chart of FIG. 8, a power-on signal Vpwon outputs “H” level during the time when the power supply voltage exceeds V1 till the power supply voltage is deceased to be lower than V2. Further, there is available an advantage that as shown in an inequality in the top right side of FIG. 7, detection levels in the increase and decrease can be freely selected as far as V2>V1 by changing resistance values of the resistors R1, R2, R1' and R2'. Incidentally, since operations of constituents are similar to those in the second embodiment, descriptions thereof are omitted.

In such a manner, contrary to the second and third embodiments, a power-on circuit in which a detection level in the increase is lower than that in the decrease can be configured. Such a power supply voltage detecting circuit is effective for the following case for example.

Even if a detection level of the power supply voltage detecting circuit is set low to some extent in increase in the power supply voltage, the circuit has a low possibility to malfunction since the power supply voltage is further increased at a point in time when a detection signal reaches a circuit on the receiver side.

However, when the power supply voltage is rapidly decreased, there can arise a situation in which a logic circuit does not operate since the power supply voltage is further decreased at a point in time when a detection signal reaches a circuit on the receiver side.

As described above, when it is required to perform a prescribed recovery operation, by detecting a decrease in the power supply voltage, a trouble that a logic circuit does not operate can occur. On this occasion, if the power supply voltage detecting circuit of the fourth embodiment is used and detection can be performed in an advanced timing in the decrease in the power supply voltage, a recovery operation when the power supply voltage is decreased can surely be performed.

In the first to fourth embodiments, while descriptions are made of the power supply voltage detecting systems in which a power-on signal is output in increase and decrease in power supply voltage, a combination of the embodiments or a combination of the embodiments with conventional examples will make it possible that a semiconductor integrated circuit of a multiple power supply type is provided with different supply voltage detecting circuits corresponding to respective power supply voltages.

As for a semiconductor integrated circuit using a down converter, while, conventionally, the same detection level has been applied to an external power supply voltage Vext and an internal power supply voltage Vint, the same detection level has been applied in increase and decrease in the power supply voltage as well and still further, power supply voltage detecting circuits with the same configuration as each other have been used in all cases, according to the present invention, such combinations in a conventional case can be changed to the following combinations:

(1) A power supply voltage detection circuit in the fourth embodiment is employed for an external power supply voltage Vext and a power supply voltage detection circuit of the second embodiment is employed for an internal supply voltage Vint. With such a configuration, decrease in external power supply voltage can be detected in an advanced timing.

(2) A conventional power supply voltage detecting circuit in which the same detection level is applied for increase and decrease in power supply voltage is employed for an external power supply voltage Vext and a power supply voltage detection circuit of the second embodiment is employed for an internal power supply voltage Vint. With such a configuration, when the power supply voltage is temporarily decreased, a power-on signal is generated and therefore, a problem that a latch is reset can be avoided.

(3) Conventional power supply voltage detecting circuits in each of which the same detection level is applied for increase and decrease in power supply voltage are both employed for an external power supply voltage Vext and an internal power supply voltage Vint, but detection levels of the respective circuits for Vext and Vint are differently set therebetween. With such a configuration and an operating condition, a detection sensitivity to a change in internal power supply voltage Vint can be increased.

If several kinds of the power supply voltage detecting circuits in combination are employed in such a manner, a power-on sequence with flexibility can be realized, in which characteristics of power supplies are reflected.

Then, a power supply voltage detecting circuit of a fifth embodiment of the present invention will be described based on FIG. 9. In a semiconductor integrated circuit in which an external power supply voltage Vext is used and an internal power supply voltage Vint is used which is generated by decreasing Vext in a down converter and applied to an internal circuit, a power supply voltage detection circuit of the fifth embodiment is at least constituted of a Vint power supply voltage detecting circuit, wherein a first detection signal is output when Vint is increased to be equal to or higher than a first voltage prescribed and a second detection signal is output when Vint is decreased to be equal to or lower than a second voltage which is lower than the first voltage.

A power supply voltage detecting circuit for Vint with such a characteristic can be obtained by adopting power supply voltage detecting circuits of the first and second embodiments for Vint. That is, in the power supply voltage detecting circuits of the first and second embodiments which are shown in FIGS. 1 and 3, Vint is only required to be handled as a power supply voltage.

Since an external power supply voltage Vext and an internal power supply voltage Vint are required to be differentiated from each other in diagrams in which the following embodiments relating to a semiconductor integrated circuit of a multiple power supply type are respective shown, a power supply terminal for Vext is marked by a black circle and a power supply terminal for Vint is marked by a circle. While power supply terminals are marked by black circles in FIGS. 1, 3, 5 and 7 used for description of the first to fourth embodiments, the black circles are not necessarily limited to Vext, but when the embodiments are applied to an internal power supply, the black circles may be changed to circles which indicate Vint.

In the fifth embodiment, description will be made, as an example, on a case where a power supply voltage detecting circuit which is similar to the first embodiment in which a power supply voltage detecting section and a Schmitt trigger circuit are connected with each other is employed especially as a power supply voltage detecting circuit for Vint.

Figure 9:
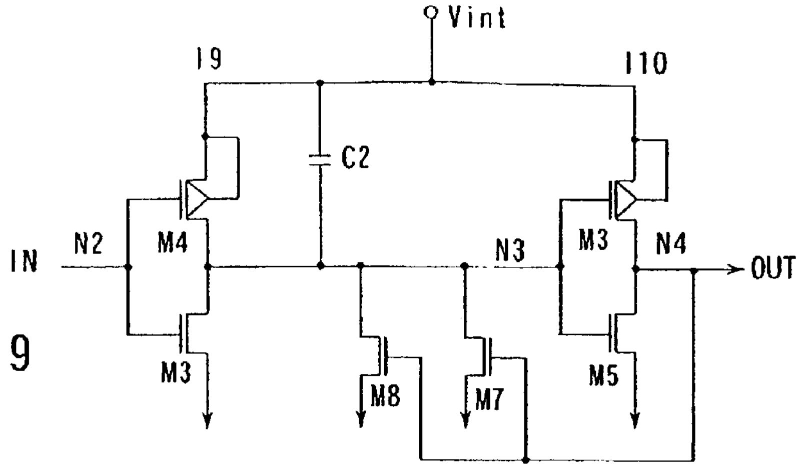
FIG. 9 is a diagram showing details of a Schmitt trigger circuit used in a fifth embodiment of the present invention.

In FIG. 9, details of a configuration of a Schmitt trigger circuit employed in the fifth embodiment will be shown. A power supply voltage detecting circuit for Vint of the fifth embodiment comprises: a Schmitt trigger circuit constructed of CMOS inverters shown in FIG. 9 and the power supply voltage detecting section 1 shown in FIG. 1 both of which are connected with each other. In this case, an internal power supply voltage Vint which is generated by decreasing an external power supply voltage Vext in a down converter on a chip is connected to power supply terminals of both circuits.

The Schmitt trigger circuit shown in FIG. 9 comprises: a CMOS inverter I9 constructed of NMOS (M3) and PMOS (M4); a CMOS inverter I10 constructed of NMOS (MS) and PMOS (M6); and a feed-back circuit, which is constructed of NMOS (M7 and M8), and in which an output of I10 is fed back to an input terminal of I10 by supplying an output voltage of I10 to the gates of NMOS (M7 and M8). Incidentally, C2 is a capacitor which reinforces the function of C1 of FIG. 1 which is described above, N2 corresponds to the node N2 in the output section of the power supply voltage detecting section shown in FIG. 1 and N3 and N4 respectively indicate the nodes in the interior and output section of the Schmitt trigger circuit.

As described above using the equations (1) and (2), when an internal power supply voltage Vint is increased to be higher than Vdetect, the node N2 changes from "L" to "H." That is, since an input IN of the Schmitt trigger circuit shown in FIG. 9 changes from "L" to "H," an output N3 of the CMOS inverter I9 at the first stage changes from "H" to "L." Accordingly, an output N4 of the CMOS inverter I10 at the next stage becomes the "H" state and a power-on signal is generated.

The "H" state of N4 is fed back to the gates of NMOS M7 and M8, and NMOS M7 and M8 is set in the ON state and therefore, the N3 is grounded to go "L" and that is, the output OUT of the Schmitt trigger circuit is retained at "H."

Then, when Vint is decreased to be lower than Vdetect, the node N2 changes from "H" to "L." Accordingly, while NMOS (M3) is off and PMOS (M4) is on in the first stage inverter, so that N3 is connected to Vint through PMOS (M4), on the other hand since N3 is grounded by NMOS (M7 and M8), the "L" state of N3 is retained and therefore, a power-on signal is not generated at Vpwon when Vint is deceased. Further, if Vint is sufficiently decreased and a retaining function of the feed-back circuit constructed of NMOS (M7 and M8) is reduced, N3 is restored to "H" and accordingly, the output OUT of the Schmitt trigger circuit is restored to "L." Incidentally, while the input/output characteristics of the Schmitt trigger circuit which is described herein inverts a logic of FIG. 2B, the characteristics are not problematic in practical use since the circuit has a hysteresis characteristic.

In the mean time, in the power supply voltage detecting circuit of the fifth embodiment, while detection levels can be changed according to when an internal power supply voltage is increased or decreased by using the hysteresis characteristic of a Schmitt trigger circuit, for example, when a 2-input AND gate is connected to the output section of the power supply voltage detecting circuit and AND of the output of the power supply voltage detecting section of FIG. 1 and the output of the power supply voltage detecting circuit of FIG. 5 is taken, it is possible that a power-on signal is not generated in an absolute sense when the internal power supply voltage Vint is decreased since both outputs do not coincide with each other during the decrease in the internal power supply voltage Vint.

The reason why a power-on signal is not output when Vint is decreased in such a manner is that, for example, when a semiconductor memory is in a sense operation, since an internal voltage Vint (corresponds to VDD voltage of an internal circuit) can be temporarily decreased down to equal to or lower than 2V, a measure is adopted so that a power-on signal is prevented from being generated in an unprepared manner.

Then, a down converter according to a sixth embodiment of the present invention will be described based on FIGS. 10 and 11. The sixth embodiment is a semiconductor integrated circuit of a multiple power supply type which is provided with down converters for stand-by and active modes in which the down converters suppress a temporary decrease in internal power supply voltage Vint immediately after transition from the stand-by mode to the active mode. In order to avoid the temporary decrease in internal power supply voltage from occurring, it is only required to set an internal power supply voltage Vstby in the stand-by mode higher than the internal power supply voltage Vint in the active mode.

Figure 10:
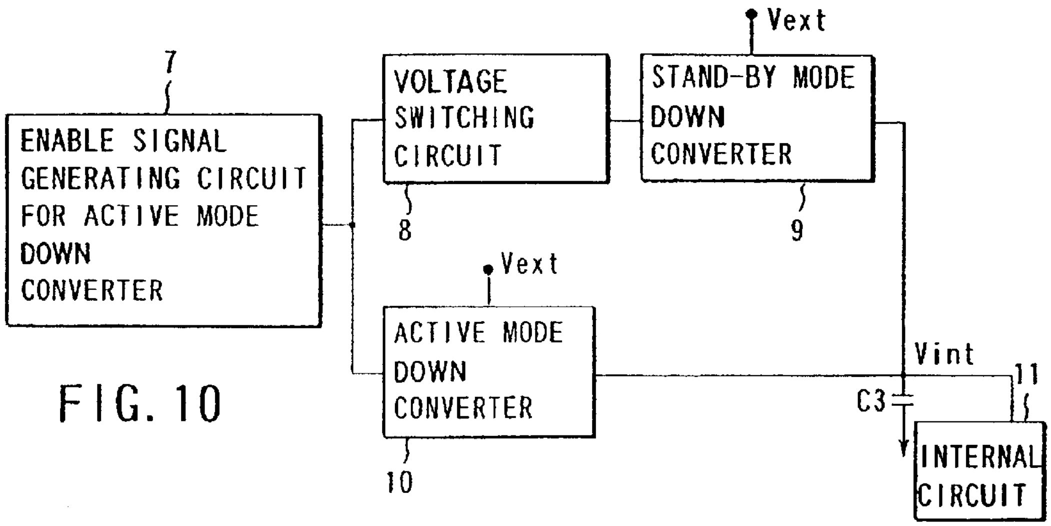
FIG. 10 is a block diagram showing a configuration of a down converter of a sixth embodiment of the present invention.

FIG. 10 is a block diagram showing a configuration of such down converter. The down converter of FIG. 10 comprises: an enable signal generating section 7 for an active mode down converter; a voltage switching circuit 8; a stand-by mode down converter 9; the active mode down converter 10; an internal circuit 11; and a stabilization capacitor C3 connected to a power supply line of the internal circuit 11.

An external power supply voltage Vext is supplied to the stand-by mode down converter 9 and the active mode down converter 10, an internal power supply voltage Vint which is obtained by decreasing of Vext at a prescribed ratio is supplied to the internal circuit 11 in the active mode of the semiconductor integrated circuit, while an internal power supply voltage Vstby which is obtained by decreasing of Vext at another ratio is supplied to the internal circuit in the stand-by mode thereof, wherein an inequality Vstby>Vint is maintained. Incidentally, in FIG. 10, there is shown a state in which Vint is applied to the internal circuit 11 in the active mode. In the stand-by mode, Vint is switched to Vstby.

That is, an enable signal output from the enable signal generating section 7 for the active mode down converter is input to the voltage switching circuit 8 of the stand-by down converter 9 and the active mode down converter 10 in parallel. The stand-by down converter 9 receives an output of the voltage switching circuit 8 and sets the internal power supply voltage Vstby for the stand-by mode when the semiconductor integrated circuit is in the stand-by mode, while setting the internal power supply voltage Vint for the active mode when the semiconductor integrated circuit is in the active mode.

Figure 11:
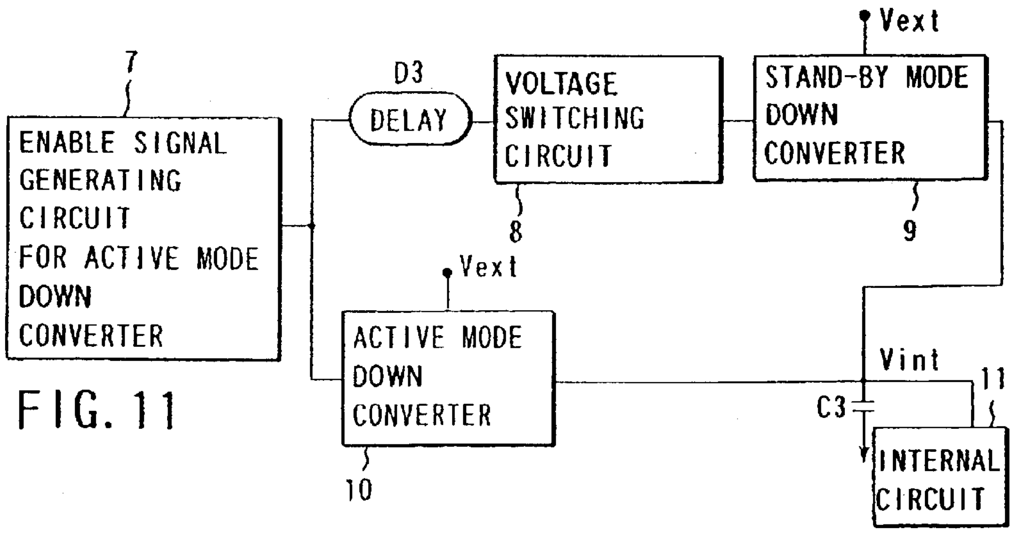
FIG. 11 is a diagram showing a configuration of a modification of the down converter of the sixth embodiment of the present invention.

Further, it is allowed that a delay circuit D3 is inserted in an input section of the voltage switching circuit 8 as shown in FIG. 11 and the stand-by mode down converter 9 continues to retain the power supply voltage Vstby in the stand-by mode till the active mode down converter 10 reaches the operating state.

Then, the reason why, if a stabilization capacitor C3 is connected to a power supply line of the internal circuit as described above and the power supply voltage Vstby in the stand-by mode is set higher than the power supply voltage Vint in the active mode, a temporary decrease in the internal power supply voltage Vint in the transition from the stand-by mode to the active mode can be avoided will be described.

When a capacitance of the stabilization capacitor C3 is denoted by C, a rise time of the active mode down converter by Tact, and an average current supplied onto the power supply line of the internal circuit from C3 till the active mode down converter reaches an operating state by Iav, the average current expressed by the following equation (6) is supplied onto the power supply line of the internal circuit during the time in which the active mode down converter reaches an operating state:

$$Iav = C \times (Vstby - Vint)/Tact \quad (6)$$

If Vstby is set so that a value of the Iav grows to be larger than an average value lint of current consumed in the internal circuit, till the active mode down converter reaches the operating state, a temporary decrease in the internal power supply voltage Vint can be avoided from occurring.

For example, in a case where C=10 nF, tact=200 nsec, Vint=2.5V and lint=8 mA, if it is set Vstby=2.7, Iav=10 mA and thereby a relation of Iav>lint can be established.

Incidentally, while that the internal power supply voltage is increased to Vstby is unlikely to be preferable in terms of hot electron resistance of MOS transistors which constitute the internal circuit, no problem associated with hot electron resistance occurs in a case where no current flows in the internal circuit as in the stand-by mode since the hot electron effect is a phenomenon which occurs when a power supply voltage is high and a current flows through a MOS transistor.

Figure 12:
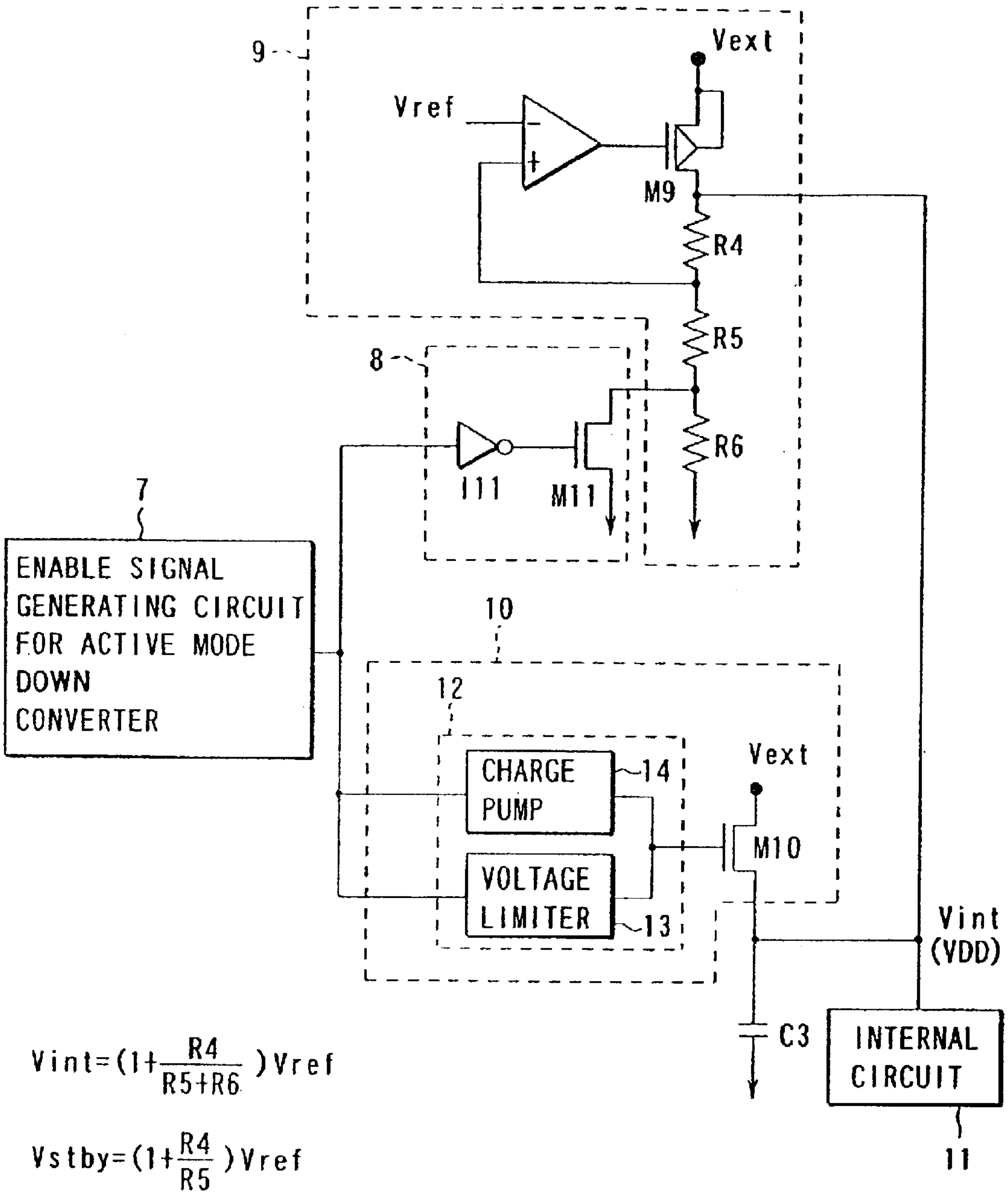
FIG. 12 is a diagram showing details of the configuration of a down converter of the sixth embodiment of the present invention.

A schematic diagram to realize a configuration of the block diagram of FIG. 10 is shown in FIG. 12. Circuit blocks of FIG. 12 are respectively indicated by the same reference numerals as those of corresponding blocks of FIG. 10.

The circuit blocks in the down converter of FIG. 12 comprises: voltage switching circuit 8 constructed of an inverter I11 and NMOS (M11); a PMOS stand-by mode down converter 9 constructed of PMOS (M9), a comparator of a differential amplification type and a resistor circuit in which resistors R4, R5 and R6 are serially connected to one another; and an NMOS active mode down converter 10 constructed from voltage generating circuit 12 including a voltage limiter 13 and a charge pump circuit 14 and NMOS (M10) for voltage decrease.

Figure 29:
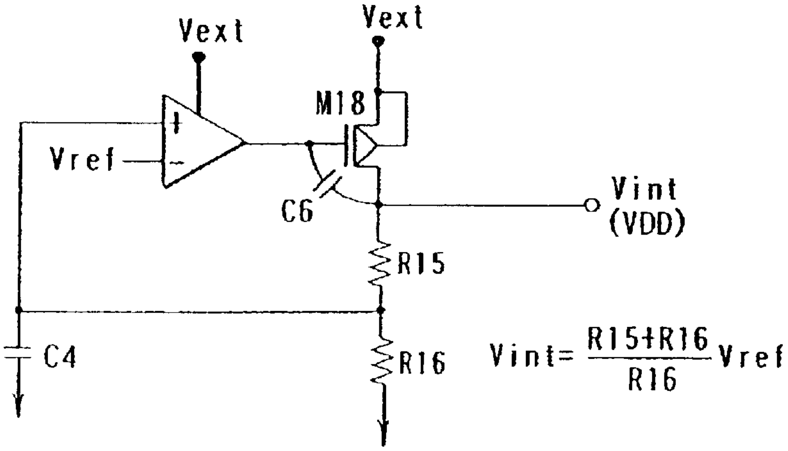
FIG. 29 (PRIOR ART)
FIG. 29 is a diagram showing a configuration of a conventional PMOS down converter.
Figure 30:
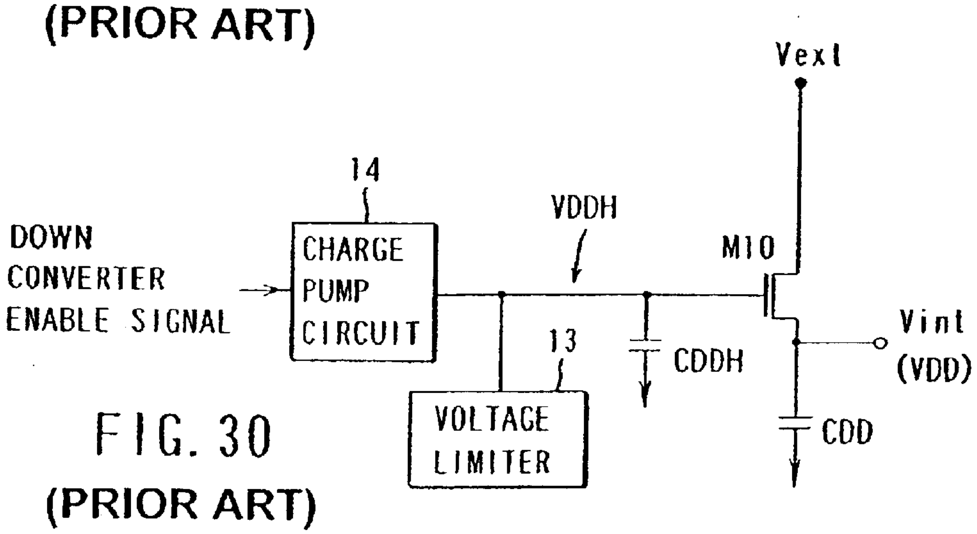
FIG. 30 (PRIOR ART)
FIG. 30 is a diagram showing a configuration of a conventional NMOS down converter.

The down converter of FIG. 12, as in FIG. 10, further comprises: an enable signal generating section 7 for the active mode down converter; a stabilization capacitor C3 and an internal circuit 11. In the mean time, in FIG. 12, a connection method for the external power supply voltage Vext to the stand-by and active mode down converters 9 and 10 is similar to the cases of the NMOS and PMOS down converters of FIGS. 29 and 30.

Then, an operation of the down converter in the sixth embodiment will be described using FIG. 12. When a semiconductor integrated circuit is in the active mode, an enable signal "H" is input to the inverter I11 of the voltage switching circuit 8 and therefore, the gate of NMOS (M11) goes "L." Accordingly, NMOS (M11) becomes the OFF state and one end of a resistance division type circuit in the stand-by mode down converter 9 is grounded through the resistor R6.

Since, in the stand-by mode down converter 9, a voltage at a connection point between R4 and R5 is fed back to one of input terminals of the comparator to the other of whose input terminals a reference voltage Vref is input and an output terminal of the comparator is connected to the gate of PMOS (M9) the source of which is connected to Vext, the voltage of the connection point is equal to Vref as a result of a function of the feed-back circuit. Accordingly, the internal power supply voltage Vint which is output from the drain of PMOS (M9) in the active mode is expressed by an equation shown in the bottom side of FIG. 12 using Vref, resistance values R4, R5 and R6 of the resistors R4, R5 and R6.

On the other hand, when the semiconductor integrated circuit is in the stand-by mode, an enable signal "L" is input to the inverter I11 of the voltage switching circuit 8 and therefore, the gate of NMOS (M11) goes "H." Accordingly, NMOS (M11) becomes the ON state and the intermediate terminal between resistors R5 and R6 of the resistance division type circuit in the stand-by mode down converter 9 is grounded through NMOS (M11). Therefore, the internal power voltage Vstby is expressed by an equation shown in the bottom side of FIG. 12 using Vref and the resistance values R4 and R5 of the resistors R4 and R5.

In such a manner, a power supply voltage of the internal circuit can be switched from Vint to Vstby (>Vint) according to the active or stand-by mode of a semiconductor integrated circuit. In the mean time, in FIG. 12, there is shown a state in which the internal power supply voltage is applied to the internal circuit 11 in the active mode as Vint (VDD).

Further, while in the active mode of operation, a large current is constantly supplied to the internal circuit 11 compared with in the stand-by mode and thereby, Vint is necessary to be maintained, a voltage and current in such an active mode are supplied from the active mode down converter 10. The active mode down converter 10 outputs Vint (VDD) to the source of NMOS (M10) by keeping the gate voltage of NMOS (M10) at Vint+Vtn (Vtn is a threshold voltage of NMOS) with the voltage generating circuit 12 including the limiter 13 and the charge pump circuit 14. Further, a supply current in the active mode is secured by increasing a gate width of NMOS (M10).

On the other hand, the stand-by down converter 9, as described above, includes the comparator and limits a current flowing in the resistance division type circuit including the resistors R4, R5 and R6 and the comparator in order to decrease power consumption.

Figure 13:
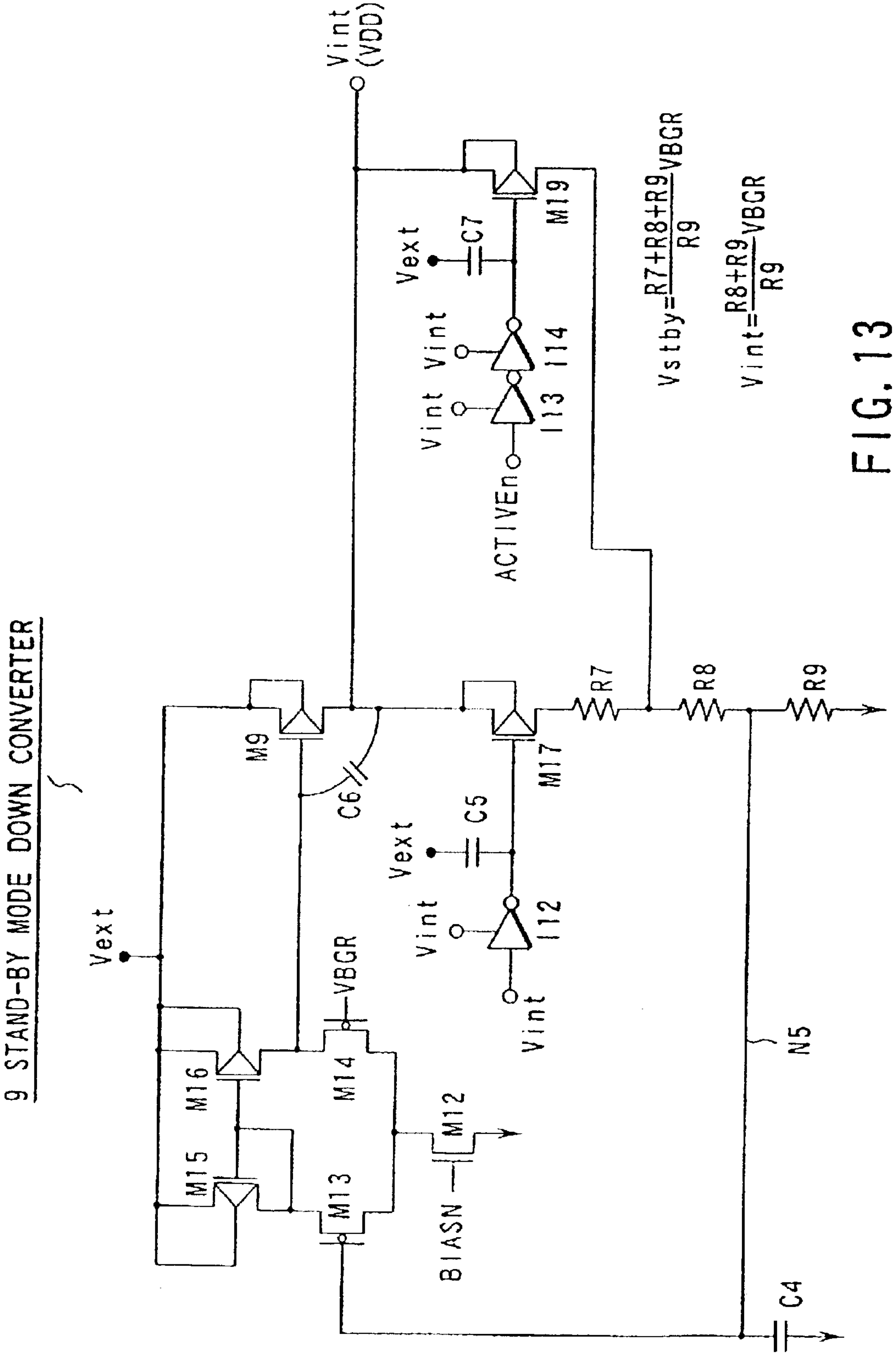
FIG. 13 is a diagram showing a circuit configuration of a PMOS stand-by mode down converter of a seventh embodiment of the present invention.

Then, a PMOS stand-by mode down converter of a seventh embodiment of the present invention will be described using FIGS. 13 and 20 to 22. In the seventh embodiment, descriptions will be given of a configuration of PMOS stand-by mode down converter 9 including a voltage switching circuit 8 in the circuit blocks constituting a down converter which have been described using FIGS. 10 to 12 together with a variety of modifications of the embodiment and accessory circuits thereof. FIG. 13 is a diagram showing an example of the circuit configuration of a PMOS stand-by mode down converter including voltage switching circuit according to the seventh embodiment.

The PMOS stand-by mode down converter 9 shown in FIG. 13 comprises: a comparator constituted of a differential amplifier including MOS transistors M12 to M16; PMOS (M9) whose drain outputs an internal power supply voltage Vint (VDD); PMOS (M17), whose gate is connected to Vint through an inverter I12, and which makes a resistance division type circuit including resistors R7, R8 and R9 in the ON state exerting a function of feed-back of Vint (restoration of decrease in Vint); PMOS (M19) as voltage switching circuit to whose gate an enable signal ACTIVEn for an active mode down converter is input through inverters I13 and I14; and the like.

An output VBGR of a BGR circuit (reference voltage generating circuit) is input to one of input terminals of the comparator as a reference voltage and a voltage of a connection node N5 between resistors R8 and R9 is input to the other of the input terminals of the comparator to form a feed-back circuit including the node N5. As the nature of the feed-back circuit, since a voltage of the connection node N5 between R8 and R9 becomes VBGR and further ACTIVEn goes "H" in the stand-by mode of a semiconductor integrated circuit, M19 is off and R7 is connected to the resistance division type circuit together with M17; while since ACTIVEn goes "L" in the active mode thereof, M19 is on and R7 is set free from the resistance division type circuit together with M17.

In such a manner, as seen from the equations shown in FIG. 13, Vint is output in the active mode of a semiconductor integrated circuit and Vstby (>Vint) is output in the stand-by mode thereof both as a power supply voltage VDD of an internal circuit. In the mean time, in FIG. 13, a situation of the circuit is shown in which Vint (VDD) is output to an output terminal of the PMOS stand-by mode down converter in the active mode of the semiconductor integrated circuit and Vint is applied to internal power supply voltage terminals indicated by circles as marks in the figure. Vint of the terminals are all switched to Vstby in the stand-by mode of the semiconductor integrated circuit.

Since there is almost no consumption of current in the internal circuit in the stand-by mode of the semiconductor integrated circuit and further neither increase nor decrease in current value occurs, designing of a feed-back system of the PMOS stand-by mode down converter shown in FIG. 13 is not so difficult. In the stand-by mode, a PMOS down converter is easier in estimation of a current than an NMOS down converter which will be described below.

In the circuit shown in FIG. 13, decrease or increase in stand-by current is realized by increase in resistance values of the resistors R7, R8 and R9, and decrease in magnitude of a current flowing though the comparator constituted of a differential amplifier by using a value of an output voltage BIASN of a constant-current source circuit, which voltage is supplied to the gate of M12. Further, the reason why the gates of PMOS (M17 and M19) are connected to the external power supply voltage Vext through the capacitors C5 and C7 is to shorten a rise time of the internal power supply voltage Vint or Vstby when a power supply is turned on.

That is, when the external power supply voltage is applied, the constant-current source circuit and the BGR circuit which are driven by Vext become the operating states and potentials of BIASN and VBGR which are outputs of thereof are fixed. At this stage, though the internal power supply voltage is still not output, a voltage of the node N5 goes "L" since PMOS (M17 and M19) become the OFF state by the capacitors C5 and C7, and accordingly, a gate voltage of PMOS (M9) also goes "L."

Hence, a power supply line (VDD) of the internal circuit is rapidly charged from Vext through PMOS (M9) which is on. When the internal power supply voltage reaches a value at some level, gate voltages of PMOS (M17 and M19) are fixed and further the internal power supply voltage is adjusted to Vint or Vstby by resistance voltage division over resistors R7, R8 and R9. In such a manner, the capacitors C5 and C7 shown in FIG. 13 function as acceleration capacitors. Incidentally, C4 is a stabilization capacitor and C6 is a capacitor for phase compensation.

Figure 20:
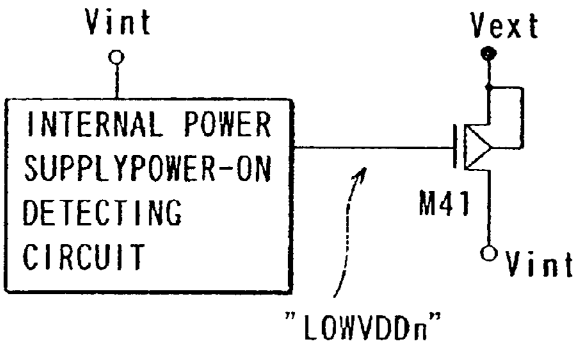
FIG. 20 is a diagram showing means for high-speed increase in internal power supply voltage.

In order to accelerate the internal power supply voltage to be increased, an acceleration circuit as shown in FIG. 20 may be employed, instead of the above described scheme or in combination thereof. The acceleration means shown in FIG. 20 is constituted of PMOS to whose source and drain are respectively connected to Vext and Vint, and to whose gate an output "LOWVDDn" of an internal power supply power-on detecting circuit is connected.

Figure 21:
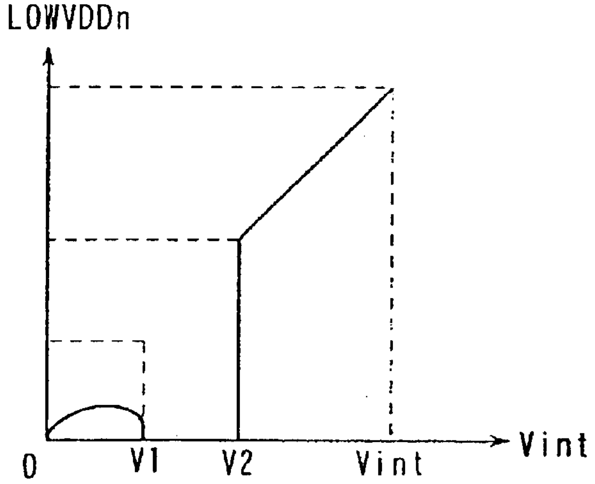
FIG. 21 is a graph of a characteristic illustrating the means for high-speed increase in internal power supply voltage.

Characteristics of LOWVDDn are as shown in FIG. 21. If a power-on signal which is generated from a detecting circuit for the internal power supply voltage Vint is LOWVDDn, when Vint is increased to reach a detection level V2 set in a power supply voltage detection section (for example, the reference numeral 1 of FIG. 1), LOWVDDn goes "H" and when Vint is further increased, OUT (an output end of LOWVDDn) of FIG. 9 is increased together with increase in Vint.

In FIG. 20, since PMOS (M41) keeps the ON state during the time when the internal power supply voltage Vint is lower than a power-on detection level V2, a power supply line of the internal power supply voltage Vint is rapidly charged by the external power supply voltage Vext through PMOS (M41). Incidentally, in FIG. 21, while there is a region where a logical level of the internal power supply power-on circuit is unstable and a small output signal has a chance to be generated in the region when Vint is equal to or lower than V1, such an unstable region does not act on the operation of PMOS (M41) in any adverse way.

Figure 22:
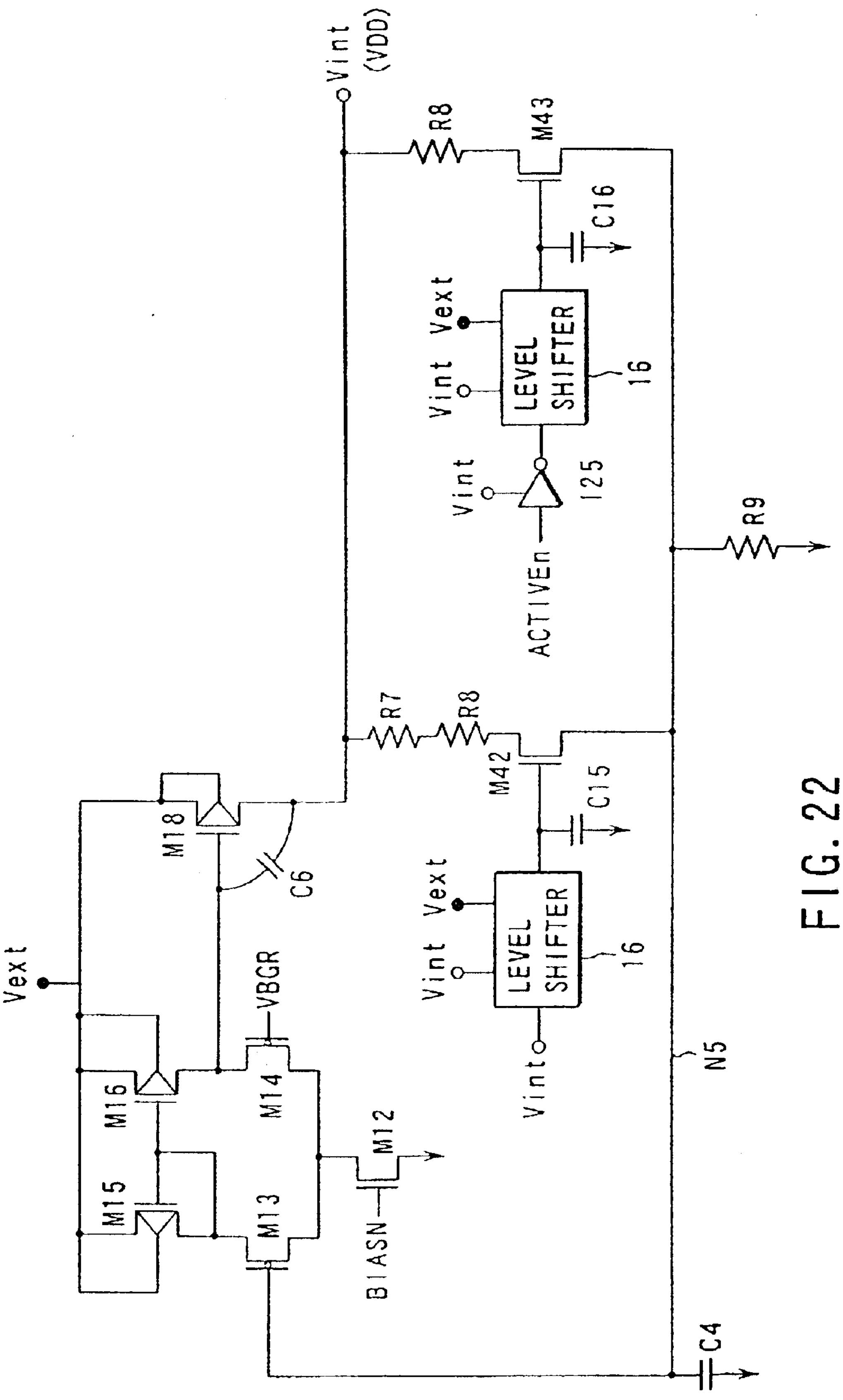
FIG. 22 is a diagram showing a modification example of a PMOS stand-by mode down converter.

As a modification of a PMOS stand-by mode down converter of the seventh embodiment, a PMOS stand-by mode down converter shown in FIG. 22 may be employed. In FIG. 22, NMOS (M42 and M43) are employed instead of PMOS (M17 and M19) of FIG. 13. Capacitors C15 and C16 are acceleration capacitance to accelerate increase in the internal power supply voltage Vint (VDD) like the capacitors C5 and C7 of FIG. 13.

Further, while it is different from FIG. 13 that, in FIG. 22, NMOS (M42) is inserted between resistors R8 and R9 and a resistor R8 is inserted between a power supply line (VDD) and NMOS (M43), resistance values of R7, R8 and R9 can be the same as those in FIG. 13.

Figure 16:
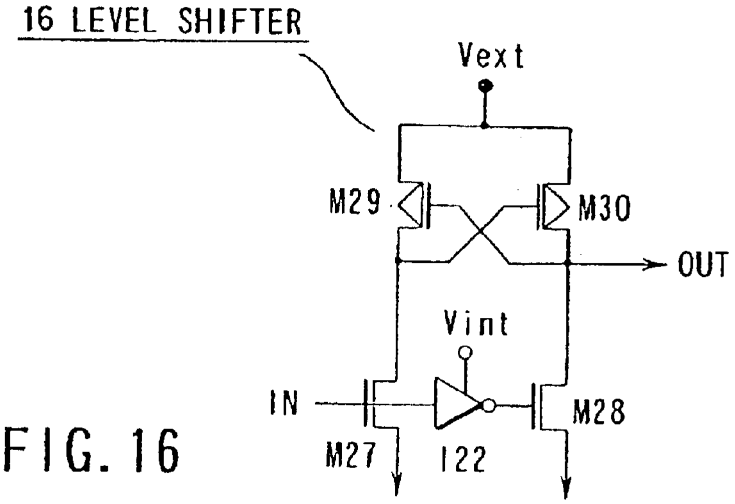
FIG. 16 is a diagram showing a configuration of a level shifter.

Then, a concrete circuit configuration of a level shifter 16 of FIG. 22 is shown in FIG. 16. The level shifter 16 is a latch circuit constructed of an inverter I22 with Vint as a power supply and a flip-flop of a CMOS type with Vext as a power supply. The reason why the level shifter 16 is inserted in FIG. 22 is to avoid decrease in threshold in voltage transfer by NMOS.

Figure 14:
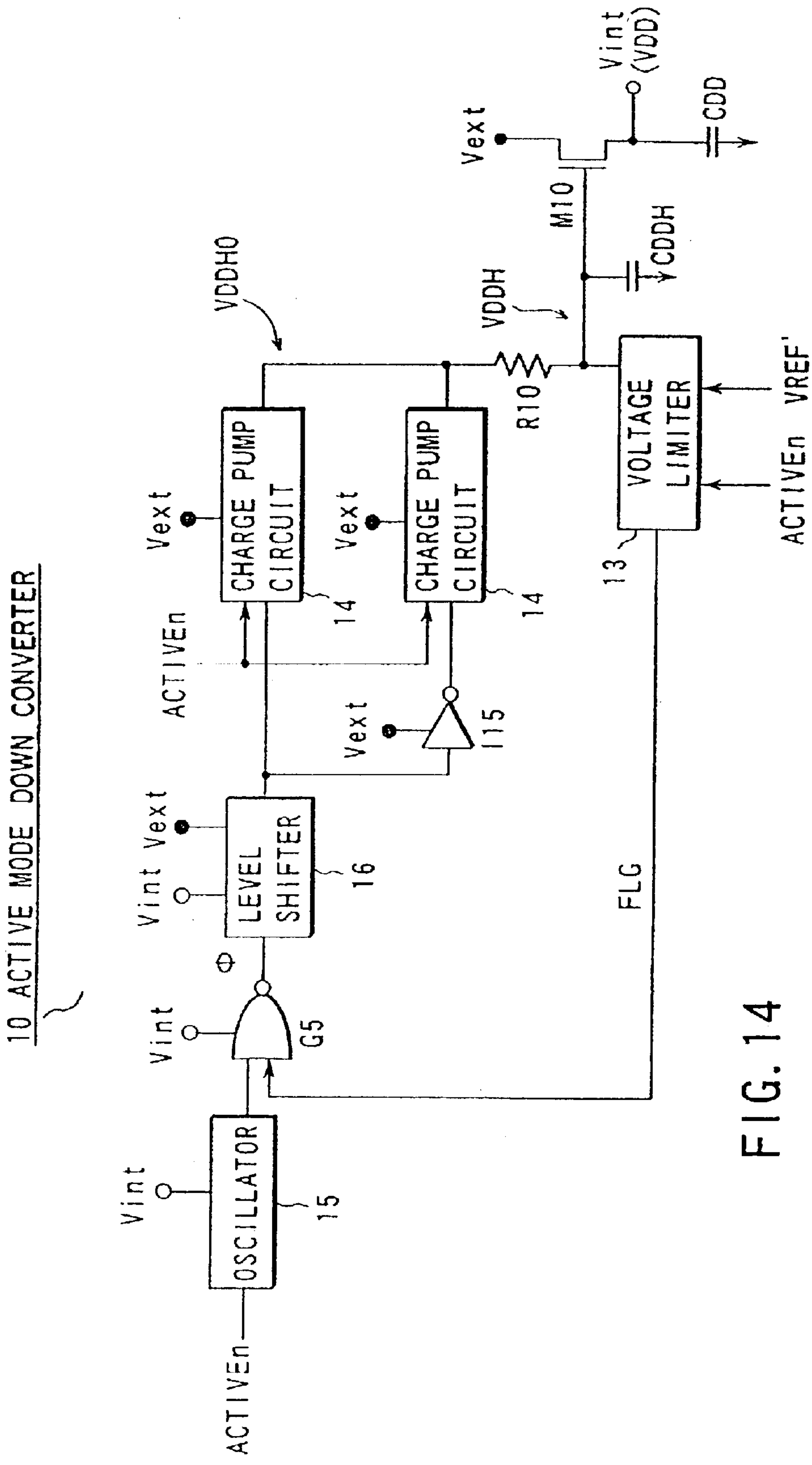
FIG. 14 is a diagram showing a circuit configuration of an NMOS active mode down converter of an eighth embodiment of the present invention.

An NMOS active mode down converter of an eighth embodiment of the present invention will be described based on FIGS. 14 to 19. In the eighth embodiment, descriptions will be given of a configuration of an active mode down converter 10 in the circuit blocks constituting the down converter which have been described using FIGS. 10 to 12 together with a variety of modifications of the embodiment and accessory circuits thereof. FIG. 14 is a diagram showing an example of the circuit configuration of an NMOS active mode down converter in an eighth embodiment.

The NMOS active mode down converter shown in FIG. 14 comprises: voltage generating circuit constructed of a voltage limiter 13 and a charge pump circuit 14; and a voltage decrease MOS (M10). The charge pump circuit 14 is provided with two charge pump circuits connected in parallel and an output of an oscillator 15 which is activated by receiving ACTIVEn is input to the two charge pump circuits through a NOR gate G5 and a level shifter 16. Since there arises a risk that when an internal power supply voltage Vint (VDD) is supplied to the charge pump circuits, a large current is consumed in a voltage increase operation and thereby, Vint (VDD) is unstable, an external power supply voltage Vext is directly supplied to the charge pump circuits in order to avoid such a fluctuation in Vint (VDD). Incidentally, inputting Vext to one of the charge pump circuits is effected through an inverter I5.

An output VDDH0 of the charge pump circuits is given to a voltage limiter 14 as a voltage VDDH through a resistor R10 and the voltage limiter 13 compares the voltage VDDH with a voltage limiter reference voltage VREF' and transfers a flag signal FLG to one of input terminals of the NOR gate G5.

VDDH is input to the gate of voltage decreasing NMOS (M10) whose drain is connected Vext and Vint (VDD of the internal circuit) is output from the source of voltage decreasing NMOS (M10). A stabilization capacitor CDDH is connected to the gate of M10 and further, a stabilization capacitor CDD (C3 of FIGS. 10 to 12) of Vint (VDD) is connected to the source of M10. Incidentally, the voltage limiter 13 and the charge pump circuits 14 are activated by ACTIVEn.

When a semiconductor integrated circuit comes to be in the active mode and ACTIVEn goes "L," the oscillator 15 is in the operating state and an output pulse (p reaches the charge pump circuits 14 by way of the level shifter 16. The reason why the level shifter 16 is inserted is that a time period required for boosting a voltage is shortened by increasing an amplitude of the output pulse $\phi$.

Figure 15:
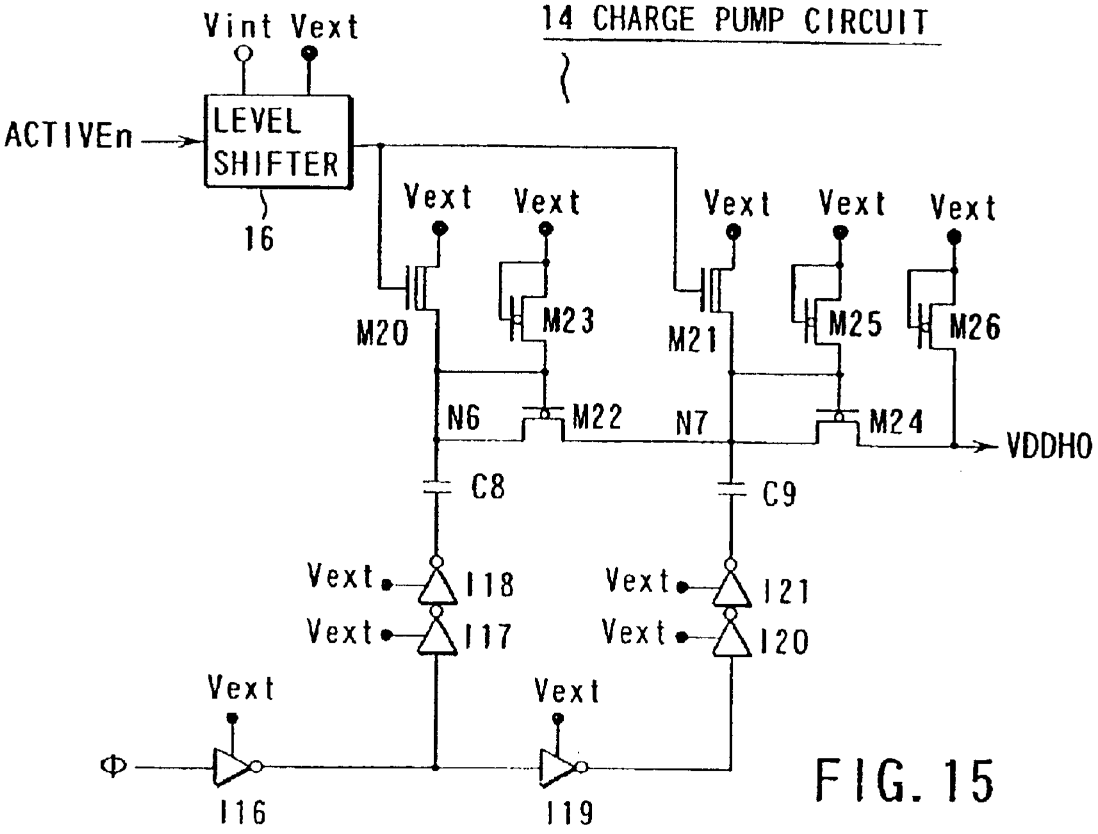
FIG. 15 is a diagram showing a configuration of a charge pump circuit.

A concrete example of a charge pump circuit 14 is shown in FIG. 15. The charge pump circuit 14 comprises: inverters I16 and I19 which receive an output pulse (p; and I type NMOS (NMOS whose threshold voltage VtI is as low as about 0.2V) M22 and M24, connected as diodes, to whose one end output pulses $\phi$ and /$\phi$ are respectively supplied through inverters I17 and I18 and a capacitor C8, and inverters I20 and I21 and a capacitor C9. The charge pump circuit 14 outputs VDDH0.

ACTIVEn is transferred to depletion type NMOS (M20 and M21) through a level shifter 16 which has above been described using FIG. 16 and ACTIVEn activates the charge pump circuits 14 in the active mode.

Since I type NMOS (M26) connected as a diode in FIG. 15 has a rectification function in which a current is made to flow in one direction from Vext to the output end VDDH0, I type NMOS (M26) keeps VDDH (almost equal to VDDH0) of FIG. 14 at Vext−VtI (VtI is a threshold voltage of M26) during the stand-by mode in cooperation with M23 and M25 and further, functions to keep a boosted voltage of VDDH when a mode of the semiconductor integrated circuit is switched from the active mode to the stand-by mode.

Hence, in a case where a mode of the semiconductor integrated circuit is switched from the active mode to the stand-by mode, and further, soon reversed to the active mode, a time period required for increase in voltage of VDDH can be saved. In the mean time, the depletion type NMOS (M20 and M21) function to keep voltages of nodes N6 and N7 at a voltage of Vext during the stand-by mode.

Figure 17A:
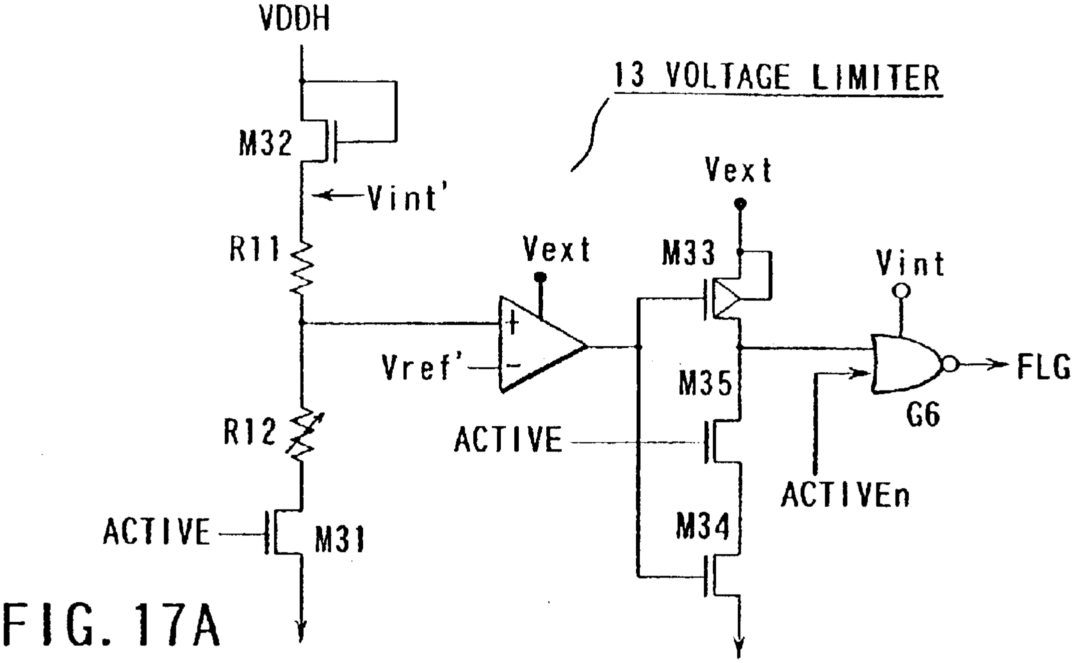
FIGS. 17A and 17B are diagrams showing configurations of a voltage limiter.

A circuit configuration of a voltage limiter is shown in FIG. 17A. The voltage limiter 13 shown in FIG. 17A comprises: a resistor R11 connected between the source of NMOS (M32), connected as a diode, to whose drain VDDH of FIG. 14 is given and the drain of NMOS (M31) to whose gate a signal ACTIVEn is input; a resistance division type circuit constituted of a variable resistor R12; a comparator of a differential amplification type to one of whose input terminals a voltage obtained by resistance voltage division of VDDH is input, and to the other of whose input terminals a reference voltage Vref' is input; CMOS inverters (M33 and M34) to the gates of which an output terminal of the comparator is connected; and a NOR gate G6 to one of whose input terminals the output terminal of the inverters (M33 and M34) is connected.

Figure 17B:
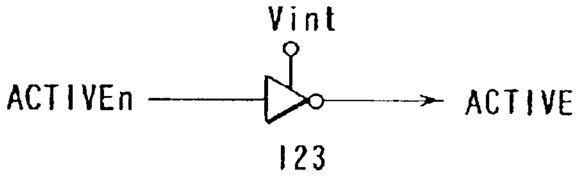

A variable resistor R12 functions to adjust a set value of the internal power supply voltage. A ratio in resistance between the resistors R11 and R12 are only required to be set so that a voltage of Vint' of FIG. 17 is a set value of the internal power supply voltage Vint. A flag signal FLG is output from an output terminal of the NOR gate G6.

In the mean time, an NMOS (M35) is further inserted in the CMOS inverter and the signals ACTIVE and ACTIVEn are respectively input to the gate of the NMOS (M35) and the other of the input terminals of the NOR gate G6. The signal ACTIVE herein is a signal obtained by inverting the signal ACTIVEn which goes "L" in the active mode of a semiconductor integrated circuit with the inverter I23 as shown in FIG. 17 B.

When VDDH of FIG. 14 reaches a prescribed voltage by the charge pump circuits 14, the voltage limiter shown in FIG. 17 compares a voltage obtained by resistance division of VDDH with Vref' to detect and outputs a flag signal FLG shown in FIG. 14 to input to one of the input terminals of the NOR gate G5. Hence, an output pulse ϕ of the oscillator 15 is not transferred to the charge pump circuits 14 and thereby, increase in VDDH is stopped.

When VDDH is decreased to lower than a prescribed level, the flag signal FLG becomes the "L" level and increase in a voltage is restarted. In such a manner, during the time when a semiconductor integrated circuit is in the active mode, VDDH is kept at a prescribed level. The resistor R10 in FIG. 14 functions as a filter that a fluctuation in output of the charge pump circuits 14 is prevented from being directly transferred to the voltage limiter 13.

Since a resistance value of R10 is of the order of 100 Ω and is small by about two orders of magnitude compared with resistance values of the resistors R11 and R12 of the voltage limiter 13 of FIG. 17, an influence thereof on a set value of the internal power supply voltage Vint can be neglected.

In FIG. 14, if the resistor R10 is omitted, there arises a problem associated with an operation as described below. That is, an output VDDH0 of the charge pump circuits 14 is fluctuated with an amplitude of about 0.5V by an influence of a pulse signal ϕ of the oscillator 15. When the VDDH0 is directly input to the voltage limiter 13, the flag signal FLG of the voltage limiter 13 is also fluctuated to go "H" or "L" according to the fluctuation in the pulse signal ϕ. While voltage boosting is also ceased or activated according to the fluctuation, if there arises the duration of voltage boosting due to such a noise, a time period required for voltage boosting is extended. If a resistor R10 is provided, a fluctuation of VDDH0 is transferred to the voltage limiter 13 in a reduced manner and thereby, the duration of voltage boosting can be shortened.

Figure 18:
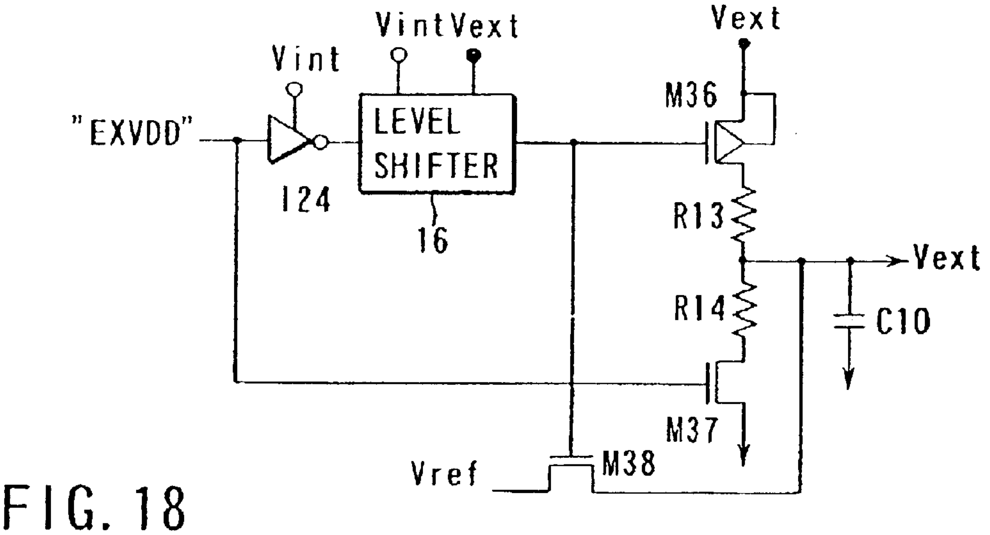
FIG. 18 is a diagram showing a configuration of a reference voltage generating circuit.

A reference voltage Vref which is used in the comparator of the voltage limiter 13 is generated by a circuit shown in FIG. 18. The Vref' generation circuit of FIG. 18 is a circuit in which Vref' to provide the internal power supply voltage Vint, which is higher than in a normal operation, to the internal circuit in the burn-in test (a current-supplied accelerated life test) in order to eliminate early failures of a semiconductor integrated circuit and Vref' in the normal operation can be switched therebetween by an internal power supply burn-in command "EXVDD."

The Vref' generation circuit shown in FIG. 18 comprises: an inverter I24 to which a signal EXVDD is input; a level shifter 16; and a resistance voltage divider including R13 and R14 between PMOS (M36) and NMOS (M37). In the circuit, an intermediate terminal of the resistance voltage divider is used as an output terminal and the drain of a transfer gate NMOS (M38), to whose gate an output terminal of the level shifter 16 is connected, and to whose source Vref is input, is connected to the output terminal of the resistance voltage divider. Incidentally, a stabilization capacitor C10 is connected to the output terminal thereof.

Further, Vext is connected to the source of PMOS (M36), an output terminal of the level shifter 16 is connected to the gate thereof, a signal EXVDD is input to the gate of NMOS (M37) and the inverter I24 in parallel, and the source of NMOS (M37) is grounded.

In such a manner, in a normal operation, when the signal EXVDD is set "L," Vref (which is obtained by trimming VBGR of FIG. 13) is output to the Vref' output without any change therein as shown in the bottom side of FIG. 18 since PMOS (M36) and NMOS (M37) are both off, while NMOS (M38) is on.

Further, in the bum-in test, if the signal EXVDD is set "H", an output obtained by dividing Vext over resistors R13 and R14 is available from the intermediate terminal of the resistance circuit since PMOS (M36) and NMOS (M37) are both on, while NMOS (M38) is off.

If the resistance ratio R14/(R13+R14) is set so that VDDH is equal to or higher than Vext+Vt, the output Vint of FIG. 14 is Vint (VDD)=Vext and therefore, the external power supply voltage Vext which is given to a power supply pad is transferred to a power supply line of the internal circuit without any change therein and the burn-in test of a semiconductor integrated circuit in a current-supplied accelerated life test can be performed. Incidentally, differentiation between "L" and "H" of a signal EXVDD is determined by a command "EXVDD" input externally.

When there is NMOS whose threshold voltage is smaller than Vext−Vint in a semiconductor integrated circuit to which the present invention is to be applied, an NMOS active mode down converter which does not require any voltage generating circuit comprising a voltage limiter 13 and a charge pump circuit 14 can be attained by using such a NMOS with the small threshold voltage as a voltage decreasing NMOS.

Figure 19:
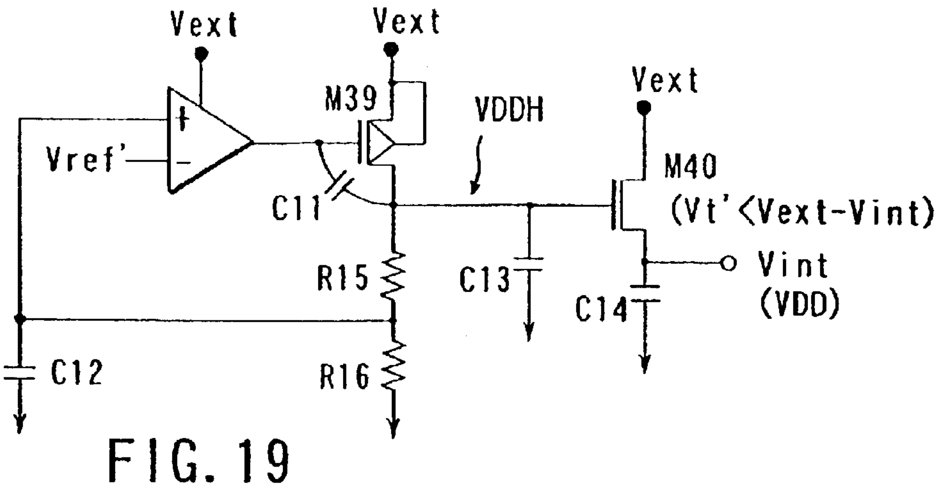
FIG. 19 is a diagram showing a modification example of an NMOS active mode down converter.

In FIG. 19, there is shown an example of a configuration of an NMOS active mode down converter which does not require the voltage generating circuit as the modification example of the NMOS active mode down converter of an eighth embodiment.

An NMOS active mode down converter of FIG. 19 comprises: a comparator to one of whose input terminals Vref' is input; PMOS (M39), to whose gate the output terminal of the comparator is connected, whose source is connected to Vext, and to whose drain a resistance division type circuit including resistors R15 and R16 is connected; a feed-back circuit in which a connection point between R15 and R16 is connected to the other of the input terminals of the comparator; and voltage decreasing NMOS (M40) to whose gate VDDH output from the drain of PMOS (M39) is input, whose drain is connected to Vext, and from whose source the internal power supply voltage Vint (VDD) is output.

In the mean time, stabilization capacitors C12, C13 and C14 are respectively connected to the feed-back circuit, a VDDH line and a Vint (VDD) output end. Further, C11 is a capacitor for phase compensation. In such a manner, if a resistance ratio R15/(R15+R16) is set so that a set value of VDDH is equal to or higher than Vint+Vt,' an output of FIG. 19 can be Vint without any charge pump circuit used. Vt' herein is a threshold voltage of the voltage decreasing NMOS (M40).

Since, in the NMOS active mode down converter shown in FIG. 19, a gate voltage VDHH of the voltage decreasing NMOS (M40) is generated without any charge pump circuit, a time period from the time when a semiconductor integrated circuit goes into the active mode till a potential of VDDH is fixed can be shortened.

A most crucial difference between an NMOS active mode down converter of the eighth embodiment and a conventional NMOS down converter is in a response speed of a system. Since a conventional NMOS down converter operates a down converter starting from the stand-by mode of a semiconductor integrated circuit, it is required to use a voltage limiter of a low power consumption. For this reason, a response time of the system constructed of a voltage limiter and a charge pump circuit is long. Conventionally, a capacitance value of CDDH (see FIG. 14) has been set large so that a voltage value of VDDH is not fluctuated even if the response speed is low.

However, since an excessively large area of layout is necessary if a value of CDDH is large like this, in an NMOS active mode down converter of the eighth embodiment, the CDDH is designed small and the response speed of the system is high so that a time period from when a semiconductor integrated circuit goes into the active mode till a voltage of VDDH is fixed is short.

Improvement of the response speed of the system is achieved by not only selecting the resistors R11 and R12 in the voltage limiter 13 of FIG. 17 so as to be small in resistance, but increasing a response speed of the comparator of a differential amplification type. If the response speed of the system is improved like this, current consumption is increased. However, in the eighth embodiment, since an NMOS active mode down converter is operated only in the active mode, increase in power consumption is not problematic.

Further, in the eighth embodiment, in order to decrease a time period till a voltage of VDDH is fixed, not only is a response speed of a system increased, but a capacitance of CDDH is selected very small compared with a conventional case. A capacitance of CDDH is set smaller than a gate capacitance of each of voltage decreasing NMOS (M10 and M40).

Since a relative high voltage VDDH is applied to CDDH as described above, CDDH is fabricated using a capacitive device with a thick oxide film. For this reason, a layout area for each unit capacitance of such a capacitive device is large compared with a capacitor of a thin oxide film. Accordingly, that a capacitance of CDDH can be decreased in the eighth embodiment is a great advantage from the viewpoint of a layout area.

In the mean time, while when CDDH is small, a fluctuation in VDDH due to a capacitive coupling and the like is large, no problem arises in the present invention since a response speed of the voltage generating circuit 12 including the voltage limiter 13 and the charge pump circuits 14 is improved and therefore, the charge pump circuits 14 quickly recovers the original voltage by detecting a fluctuation in the gate voltage.

In the sixth to eighth embodiments described above, descriptions are given of circuit configurations of the down converter in which a PMOS circuit is used in the stand-by mode of a semiconductor integrated circuit, while an NMOS circuit is used in the active mode thereof. The following advantages arise by respectively using PMOS and NMOS down converters in stand-by and active modes:

(1) since a PMOS down converter is used in the stand-by mode, estimation of a stand-by current becomes easy and the current is also easy to be decreased, (2) advantages such as a good stability and ease in designing of an NMOS down converter are retained, and (3) a capacitance of CDDH (a capacitor for stabilization of a gate voltage of NMOS) can be decreased compared with a case where an NMOS down converter is, as a single kind, used and thereby, a layout area is decreased.

Further, especially, advantageous points of an NMOS active mode down converter according to the eighth embodiment over a conventional example are compiled in the following table.

| | Conventional example | Embodiment |
|---|---|---|
| $V_{DDH}$ rise time and response time | Long (~μsec) | Short (~100 nsec) |
| $C_{DDH}$ | Large (~nF) | Small (~100 PF) |
| Layout area | Large area of $C_{DDH}$ | Small area of $C_{DDH}$ |

Then, a ninth embodiment of the present invention will be described based on FIGS. 23 to 25. The ninth embodiment relates to a layout of an NMOS down converter which requires a large gate width. According to this approach, since a distance between a voltage decreasing NMOS and a peripheral circuit block to which an internal power supply voltage Vint (hereinafter referred to as VDD) or to part of which an external power supply voltage Vext is supplied can be the minimum, there is no risk that a parasitic resistance arises in the source of the voltage decreasing NMOS. Further, VDD and Vext can be supplied freely without any restriction on layout of the peripheral circuit block.

As described above, while there are available of a PMOS type and of an NMOS type in a down converter which controls VDD, a magnitude of the gate width W has to be of the order of 100 mm, since the NMOS down converter operates a voltage decreasing NMOS in a sub-threshold region.

In such a manner, since a voltage decreasing NMOS requires a large layout, a parasitic resistance arises in a power supply line, which is a problem associated with an operation, unless specific contrivance is made on layout. Further, since two kinds of power supply lines which supply VDD and Vext are arranged on a chip, an overhead in layout arises.

In the layout of the ninth embodiment, a down converter is formed in a lower layer of Vext interconnection, PMOS regions of two peripheral circuit blocks constructed of CMOS are both formed in a lower layer of VDD interconnection and NMOS regions of the two peripheral circuit blocks are both formed in a lower layer of VSS interconnection (ground line), wherein VDD interconnections are arranged on the both sides of a Vext interconnection symmetrically with respect to the Vext interconnection, and VSS interconnections are arranged on the outside of the VDD interconnections symmetrically with respect of the Vext interconnection, whereby power supply interconnection from the Vext interconnection and the VDD interconnection of the down converter to the two peripheral circuit blocks adjacent thereto can be realized with the smallest distances.

With such a structure, since the voltage decreasing NMOS (M10) and the VDD stabilization capacitor CDD of FIG. 14 can be connected to the two peripheral circuit blocks with the smallest equal distances, control with higher sensitivity can be expected. Further, there can be enjoyed an advantage that supply of Vext and VDD can be effected without any restriction on layout.

Figure 23:
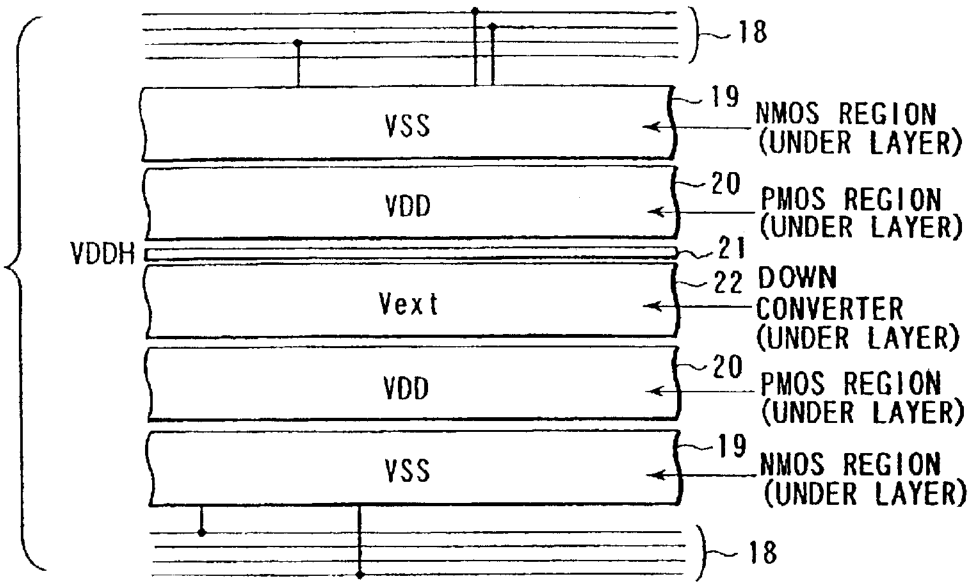
FIG. 23 is an illustration showing a layout of power supply interconnection of a ninth embodiment of the present invention.
Figure 24:
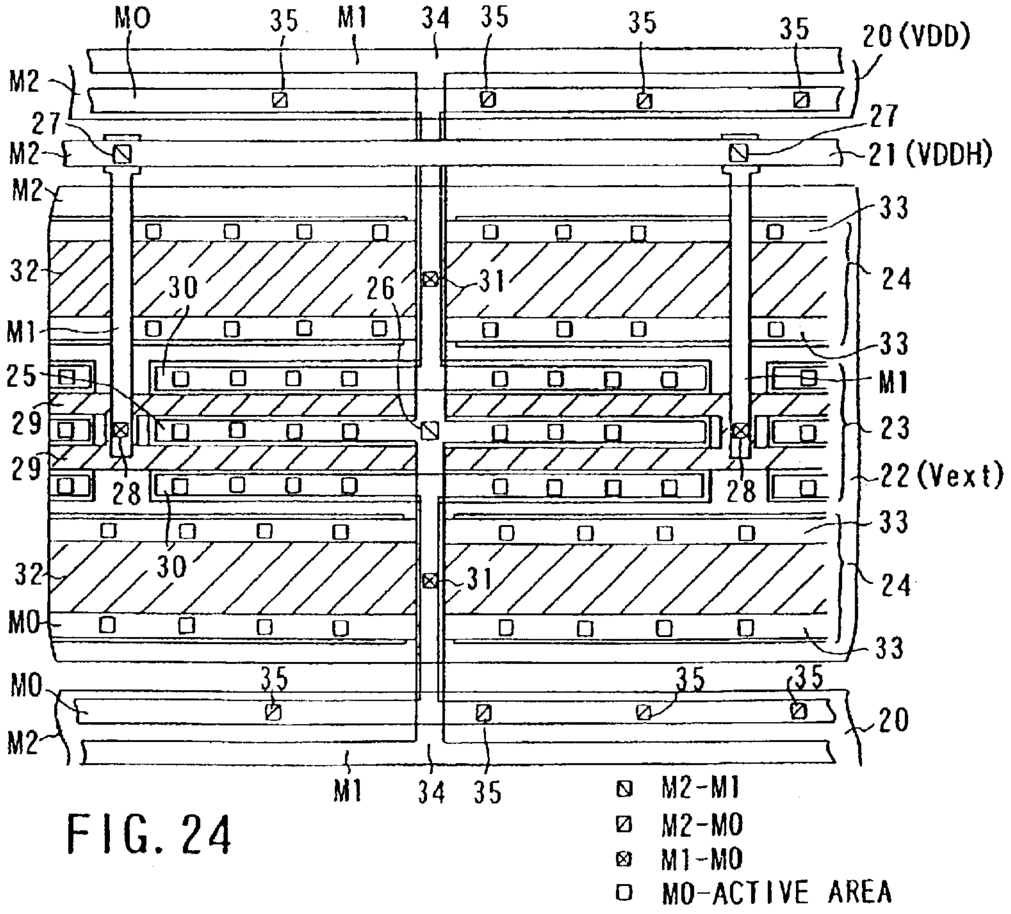
FIG. 24 is an illustration showing a layout of a down converter and power supply interconnection of the ninth embodiment of the present invention.

A layout of the ninth embodiment is shown in FIG. 23. As shown in the figure, a Vext interconnection 22 made of a third metal layer is arranged in the center and a VDD interconnection 20 and a VSS interconnection 19 made of the third metal layer in a similar manner are arranged on both sides of the Vext interconnection 22 symmetrically with respect thereto. Incidentally, a VDDH interconnection 21 made of the third metal layer is formed on one side of the Vext interconnection 22. Further, bus lines 18 are arranged along the VSS interconnections 19.

As shown by an arrow in FIG. 23, an NMOS active mode down converter of the present invention including a voltage decreasing NMOS (M10) and a VDD stabilization capacitor CDD are formed in a lower layer of the Vext interconnection 22 and an output terminal of the down converter is connected to the VDDH interconnection and the VDD interconnections 20.

The PMOS regions of the two peripheral circuit blocks constructed of CMOS are formed in a lower layer of the VDD interconnections 20 arranged in an adjacent manner to both sides of and in symmetry with respect to the Vext interconnection 22 and the NMOS regions of the two peripheral circuit regions are formed in a lower layer of the VSS interconnections 19 arranged on the outside of the VDD interconnections and in symmetry with respect to the Vext interconnection 22.

Then, the layout of a semiconductor integrated circuit of the ninth embodiment will be described using FIG. 24. In FIG. 24, a numerical mark 22 which occupies a majority of a central part area is a Vext interconnection made of the third metal layer (indicated by M2 in the figure), 21 is a VDDH interconnection made of the third metal layer and 20 which are respectively shown partly in both sides, upper and lower, are VDD interconnections made of the third metal.

A common drain 25 of voltage decreasing NMOS (M10) is formed in a region 23 which is collectively indicated by a bracket in the center of the Vext interconnection 22 and gates 29 thereof indicated by hatching in the figure are formed on both sides of and in symmetry with respect to the common drain 25. Sources 30 of voltage decreasing NMOS (M10) are formed on the outside of and in an adjacent manner to a gate 29. Since a gate width of voltage decreasing NMOS (M10) is very large to be 100 mm, two NMOS arranged on both sides of and in symmetry with respect to the common drain 25 are in parallel connected and thereby an effective gate width is realized twice as wide as actual in this structure.

The stabilization capacitors CDD for the VDD voltage are formed in regions 24 respectively indicated collectively by brackets ON both sides of the voltage decreasing NMOS (M10). Each CDD is formed with a gate 24 of a MOS structure indicated by hatching in a region 24 as one electrode thereof and with a source/drain 33 on both sides of the gate 32 short-circuited to each other as the other electrode thereof.

Connection of a power supply line to voltage decreasing NMOS (M10) and the VDD voltage stabilization capacitor CDD is effected in the following manner. As described above, two voltage decreasing NMOS (M10) 23 connected in parallel are arranged in the center of the Vext interconnection 22 and the Vext interconnection 22 is connected to the drain 25 of the voltage decreasing NMOS (M10) 23 through a contact hole 26 in the center.

The contact hole 26 herein is used for connection of the third metal layer M2 in which the Vext interconnection 22 is formed between a second metal layer M1 in which the common drain 25 of the voltage decreasing NMOSs (M10) 23 is formed and indicated through a mark M2-M1 in the bottom side of the figure. Likewise, a contact hole connecting the third metal layer and a first metal layer therethrough is indicated by M2-M0, a contact hole connecting the second metal layer and the first metal layer therethrough by M1-M0, a contact hole connecting the first metal layer and an active region on a silicon substrate therethrough by M0—ACTIVE AREA, which are all shown in the bottom side of FIG. 24.

A VDDH interconnection 21 made of the third metal layer M2 along the Vext interconnection 22 is connected to the second interconnection layer M1 through the contact hole 27 and further connected to a gate 29 of a voltage decreasing NMOS (M10) 23 through the contact hole 28.

Further, a voltage VDD of a source 30 of a voltage decreasing NMOS (M10) is led out by the first metal layer M0 and connected to a gate 32 of a MOS structure constituting the stabilization capacitor CDD 24 through a contact hole 31.

The voltage VDD is further led out by the first metal layer M0 to the both sides of the Vext interconnection and connected to a VDD interconnection made of the third metal layer through a contact hole 35. The contact hole 35 is a contact hole connecting M2-MO therethrough.

The source/drain 33 of a stabilization capacitor CDD is short-circuited by the second metal layer M1, led out up to a VDD interconnection and further connected to a VDD interconnection made of the third metal layer (not shown).

Further, the Vext interconnection is connected to the second metal layer M1 by the drain 25 of voltage decreasing NMOS (M10) 23 and thereafter, led out to both sides 34 of the Vext interconnection 22 through the second metal layer M1. With such a structure, the VDD voltage is output on the VDD interconnections 20 made of the third metal layer on both side of the Vext interconnection 22 and the Vext voltage is output by an interconnection 34 made of the second metal layer M1 in parallel to the VDD interconnection 20. That is, the VDD interconnection 20 and the Vext interconnection 34 which is branched from the Vext interconnection 22 are doubly arranged on both sides of the Vext interconnection 22.

Since a PMOS region of a peripheral circuit block is arranged adjacent to the Vext interconnection 22, a VDD interconnection 20 led out from the source 30 of a voltage decreasing NMOS (M10) 23 can be used as the power supply line for the PMOS region without any change. Further, the Vext voltage can easily be supplied to peripheral circuits such as a charge pump circuit which require the Vext voltage by extending the interconnection 34 made of the second metal layer M1.

Figure 25:
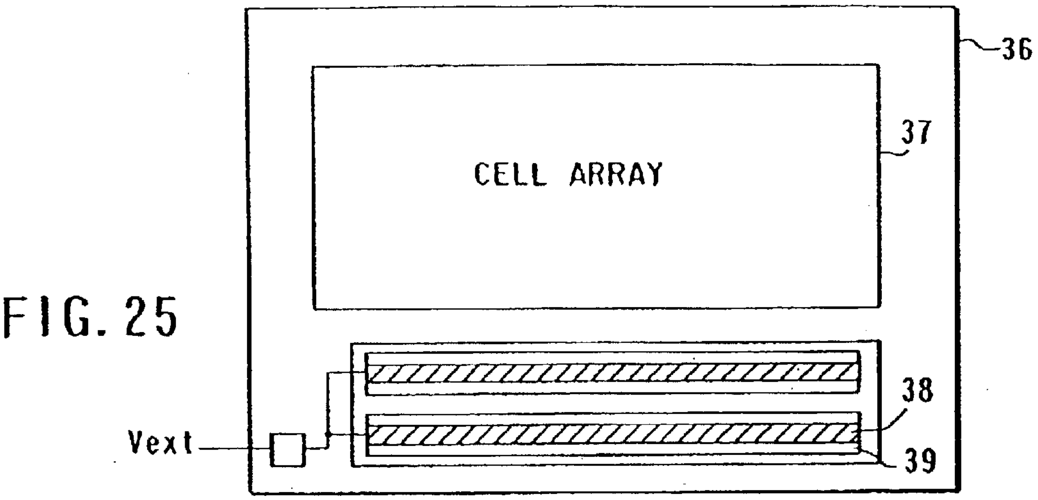
FIG. 25 is a conceptual illustration showing a layout of a semiconductor integrated circuit of the ninth embodiment of the present invention.
Figure 26:
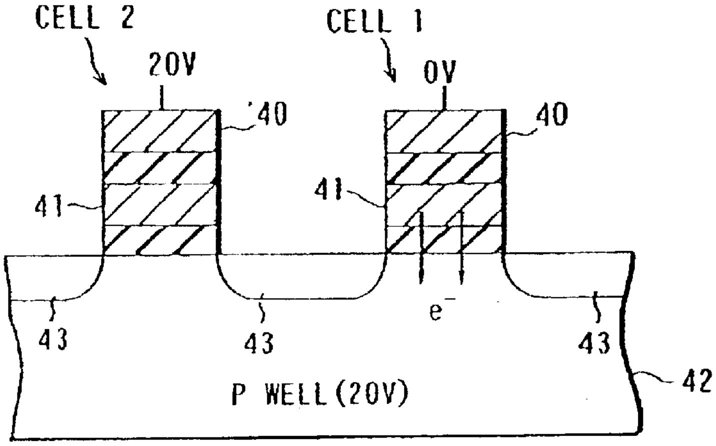
FIG. 26 (PRIOR ART)
FIG. 26 is a sectional view illustrating an erase operation of a NAND EEPROM and a problematic point thereof.

FIG. 25 is a conceptual illustration showing a layout example of a semiconductor integrated circuit of the ninth embodiment. The semiconductor integrated circuit shown in FIG. 25 comprises: a memory cell array 37 formed on a semiconductor chip 36; down converters 38; and peripheral logic circuits 39. Since peripheral logic circuits 39 are arranged on both sides of a down converter 38 symmetrically with respect thereto, and VDD and Vext are supplied from a site very close to a down converter 38, a length of power supply interconnection can extremely be reduced compared with that of a conventional semiconductor integrated circuit.

Since interconnection resistance added to the sources of voltage decreasing NMOS (M10) can be the minimum according to the layout of the ninth embodiment, precise control of the VDD voltage can be achieved. Further, since stabilization capacitors CDD for the VDD voltage can be connected to peripheral logic circuit blocks in a uniform manner in terms of interconnection resistance, the stabilization capacitors CDD can effectively used in a uniform manner even when a power supply current is locally increased according to an operating state.

While, in the embodiments described above, descriptions are given of power supply voltage detection circuits of a semiconductor integrated circuit which generates power-on signals at different detection levels; down converter of a semiconductor integrated circuit, which comprise circuits respectively for the stand-by and active modes, and whereby no decrease in voltage occurs even immediately after switching between the operating modes; and related layouts, it is to be understood that the present invention is not limited to the above described embodiments, but the embodiments can be modified or altered in various ways without any departure from the scope of the present invention as hereinafter claimed.

Effects of the present invention will be described. According to the present invention, as described above as well, there can be provided a semiconductor integrated circuit which includes a power supply voltage detection circuit which respectively generates power-on signals when a power supply voltage is increased to be equal to or higher than a prescribed voltage V1 and when a power supply voltage is decreased to be equal to or lower than a prescribed voltage V2 that is different from the V1. Especially, when down converter is used, a power supply voltage detection circuit which satisfies a condition V1>V2 has an effect not to detect instantaneous decrease in power supply voltage. Further, a power supply voltage detection circuit which is in a condition V1<V2 has an effect that decrease in power supply voltage is immediately detected and a prescribed operation of recovery is surely performed.

Further, according to the present invention, in a semiconductor integrated circuit including stand-by and active mode down converters, an effect is obtained that a temporary decrease in internal power supply voltage immediately after transition from the stand-by mode to the active mode can be suppressed.

Further, according to the present invention, there can be provided down converter exerting an excellent effect on realization of easy designing and decreasing a stand-by current by selectively using NMOS and PMOS down converters therebetween according an operating state. Further, in a case where the down converter is applied to a nonvolatile memory, there is another effect to greatly decrease a layout area.

Further, according to a layout method for a semiconductor integrated circuit of the present invention, since a distance between down converter and a peripheral circuit block to which a VDD voltage is supplied can be minimum, there arises no risk that a parasitic resistance is added to a source of the voltage-decreasing NMOS. Thereby, down converter with high controllability can be realized.

Further, a VDD interconnection and a Vext interconnection are formed in a two layer structure by forming a branched interconnection of the Vext interconnection above a down converter in a lower layer of the VDD interconnection whose VDD voltage is output from the down converter and thereby, the VDD and the Vext can both be supplied to a peripheral circuit block with the minimum distances, so that there can be provided an effect that a necessary power supply line to a peripheral circuit block can be selected only in interconnection layers and thereby, layout of a peripheral circuit block in a chip can freely be designed.

Additional advantages and modifications will readily occur to those skilled in the art. Therefore, the invention in its broader aspects is not limited to the specific details and representative embodiments shown and described herein. Accordingly, various modifications may be made without departing from the spirit or-scope of the general inventive concept as defined by the appended claims and their equivalents.

What is claimed is:

1. A semiconductor integrated circuit comprising:

a power supply voltage detecting circuit which, when a power supply voltage is higher than a first voltage, outputs a high level voltage, and when the power supply voltage is lower than the first voltage, outputs a low level voltage; and a detection signal output circuit which receives the output voltage of said power supply voltage detecting circuit, and outputs a first detection signal when said power supply voltage is increased to be equal to or higher than the first voltage, and a second detection signal when the power supply voltage is decreased to a second voltage lower than the first voltage, the detection signal output circuit comprising a Schmitt trigger circuit, wherein the Schmitt trigger circuit comprises:

an input CMOS inverter comprised of an N channel MOS transistor and a P channel MOS transistor;

an output CMOS inverter comprised of an N channel MOS transistor and a P channel MOS transistor; and a feed-back circuit, which is comprised of N channel MOS transistors connected in parallel between an input terminal of the output CMOS inverter and a reference potential, in which an output terminal of the output CMOS inverter is connected to gates of the N channel MOS transistors connected in parallel so that an input signal of the output CMOS inverter is fed back to the input terminal of the output CMOS inverter.

2. A semiconductor integrated circuit comprising:

a power supply voltage detecting circuit which, when a power supply voltage is higher than a first voltage, outputs a high level voltage, and when the power supply voltage is lower than the first voltage, outputs a low level voltage wherein the power supply voltage detecting circuit comprises:

first and second resistors serially connected at first terminals thereof, a second terminal of the first resistor being connected to a power supply node;

an N channel MOS transistor whose drain is connected to a second terminal of the second resistor and whose source is connected to ground;

a P channel MOS transistor whose source is connected to the power supply node and whose drain is connected to an output terminal;

a third resistor which is connected between the drain of the P channel MOS transistor and ground; and a stabilization capacitor which is connected between the drain of the P channel MOS transistor and ground in parallel to the third resistor; and a detection signal output circuit which receives the output voltage of said power supply voltage detecting circuit, and outputs a first detection signal when said power supply voltage is increased to be equal to or higher than the first voltage, and a second detection signal when the power supply voltage is decreased to a second voltage lower than the first voltage.

3. The semiconductor integrated circuit according to claim 2, wherein the N channel MOS transistor is a diode-connected transistor.

4. The semiconductor integrated circuit according to claim 2, wherein a capacitor reinforces the stabilization capacitor.

* * * * *